(12) United States Patent
Ogawa et al.

(10) Patent No.: US 7,220,468 B2
(45) Date of Patent: May 22, 2007

(54) CONDUCTIVE ORGANIC THIN FILM, METHOD FOR MANUFACTURING THE SAME, AND ELECTRONIC DEVICE, ELECTRIC CABLE, ELECTRODE, PYRROLYL COMPOUND, AND THIENYL COMPOUND USING THE SAME

(75) Inventors: Kazufumi Ogawa, Nara (JP); Norihisa Mino, Nara (JP); Shinichi Yamamoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/488,994

(22) Filed: Jul. 19, 2006

(65) Prior Publication Data

US 2006/0257588 A1    Nov. 16, 2006

Related U.S. Application Data

(62) Division of application No. 10/465,939, filed as application No. PCT/JP01/11325 on Dec. 25, 2001.

(30) Foreign Application Priority Data

Dec. 26, 2000    (JP)    ............................. 2000-395701

(51) Int. Cl.
  *C09K 19/06*    (2006.01)
(52) U.S. Cl. ...................... 428/1.23; 428/1.2; 428/446; 428/447; 427/99.6; 349/131; 257/E51.028; 257/E51.029; 257/E51.033
(58) Field of Classification Search ................ 428/1.2, 428/1.23, 1.52, 1.55, 446–447; 427/99.4; 349/124, 126, 131, 135; 257/E51.028, E51.029, 257/E51.033, E51.037
See application file for complete search history.

(56) References Cited

U.S. PATENT DOCUMENTS 3,957,347 A    5/1976    Saeva (Continued)

FOREIGN PATENT DOCUMENTS

CN    1483205    3/2004

(Continued)

OTHER PUBLICATIONS

"Novel entry to the tropane system by reaction of rhodium(II) acetate stabilized vinylcarbenoids with pyrroles." Tetrahedron Letters, vol. 30, No. 35, 1989, pp. 4653-4656.

(Continued)

*Primary Examiner*—Rena Dye
*Assistant Examiner*—Sow-Fun Hon
(74) *Attorney, Agent, or Firm*—Hamre, Schumann, Mueller & Larson, P.C.

(57) ABSTRACT

It is an object to provide a conductive organic thin film having organic molecules that include at one end a terminal bonding group that is covalently bonded to a substrate surface, a conjugate bonding group that is located at any portion of the organic molecules and that is polymerized with other molecules, and a polar functional group that does not include active hydrogen and that is located at any portion between the terminal bonding group and the conjugate bonding group, wherein the organic molecules are oriented and their conjugate bonding groups are polymerized, forming a conduction network. The conductivity ($\rho$) of the conductive organic thin film at room temperature (25° C.) is at least $5.5 \times 10^5$ S/cm, and preferably at least $1 \times 10^7$ S/cm, without dopants, having significantly higher conductivity than metals such as gold and silver. In particular, a film of polypyrrole or polythienylene conjugate bonds that is polymerized through polymerization through electrolytic oxidation has high conductivity.

3 Claims, 13 Drawing Sheets

U.S. PATENT DOCUMENTS

| | | | |
|---|---|---|---|
| 5,008,127 | A | 4/1991 | Ogawa |
| 5,017,975 | A | 5/1991 | Ogawa |
| 5,130,162 | A | 7/1992 | Ogawa et al. |
| 5,223,331 | A | 6/1993 | Ogawa et al. |
| 5,270,417 | A | 12/1993 | Soga et al. |
| 5,326,661 | A | 7/1994 | Sansone et al. |
| 5,353,632 | A | 10/1994 | Nakagawa |
| 5,413,887 | A | 5/1995 | Ueda |
| 5,468,551 | A | 11/1995 | Ogawa |
| 5,676,814 | A | 10/1997 | Honda et al. |
| 5,912,473 | A | 6/1999 | Wakita et al. |
| 5,965,761 | A | 10/1999 | Buchecker et al. |
| 6,995,506 | B2 | 2/2006 | Ogawa |
| 2002/0057398 | A1 | 5/2002 | Ogawa |

FOREIGN PATENT DOCUMENTS

| | | |
|---|---|---|
| EP | 0 339 677 | 11/1989 |
| EP | 0 383 584 | 8/1990 |
| EP | 0 385 656 | 9/1990 |
| EP | 0 441 326 | 8/1991 |
| EP | 0 469 243 | 2/1992 |
| EP | 0 481 362 | 4/1992 |
| EP | 0 552 637 | 7/1993 |
| EP | 0 962 460 | 12/1999 |
| EP | 1 179 863 | 2/2002 |
| JP | 34-19965 | 12/1959 |
| JP | 59-57741 | 4/1984 |
| JP | 60-146406 | 8/1985 |
| JP | 2-27766 | 1/1990 |
| JP | 3-229710 | 10/1991 |
| JP | 5-81921 | 4/1993 |
| JP | 5-87559 | 4/1993 |
| JP | 5-117624 | 5/1993 |
| JP | 5-175485 | 7/1993 |
| JP | 5-274919 | 10/1993 |
| JP | 6-242352 | 9/1994 |
| JP | 7-66990 | 7/1995 |
| JP | 7-221367 | 8/1995 |
| JP | 8-50818 | 2/1996 |
| JP | 2507153 | 4/1996 |
| JP | 9-162440 | 6/1997 |
| JP | 10-153783 | 6/1998 |
| JP | 2000-268634 | 9/2000 |

OTHER PUBLICATIONS

"Synthesis of (±) -Ferruginine and (±) -Anhydroecgonine Methyl Ester by a Tandem Cyclopropanation/Cope Rearrangement" J. Org. Chem., vol. 56, No. 19, 1991, pp. 5696-5700.

Collard, David M. et al. "Lamellar Conjugated Polymers by Electrochemical Polymerization of Heteroarene-Containing Surfactants: Potassium 3-(3-Alkylpyrrol-1-yl)propanesulfonates," Chemistry of Materials, vol. 6, pp. 850-857 (1994).

Lo, Rung-Kuang et al. Polypyrrole Growth on $YBa_2Cu_3O_{7-o}$ Modified with a Self-Assembled Monolayer of N-(3-Aminopropyl)pyrrole: Hardwiring the "Electroactive Hot Spots: on a Superconductor Electrode" Journal of the American Chemical Society. vol. 118, pp. 11295-11296 (1996).

Michalitsch R. et al. "β-Functionalized Oligothiophenes for molecular self-assembly" Synthetic Metals, vol. 101, pp. 5-6 (1999).

Berlin, Anna et al. "Self-assembly of mono- and multilayers of polyconjugated conducting polymers" Marcromolecular Rapid Communications, vol. 21, pp. 301-318 (2000).

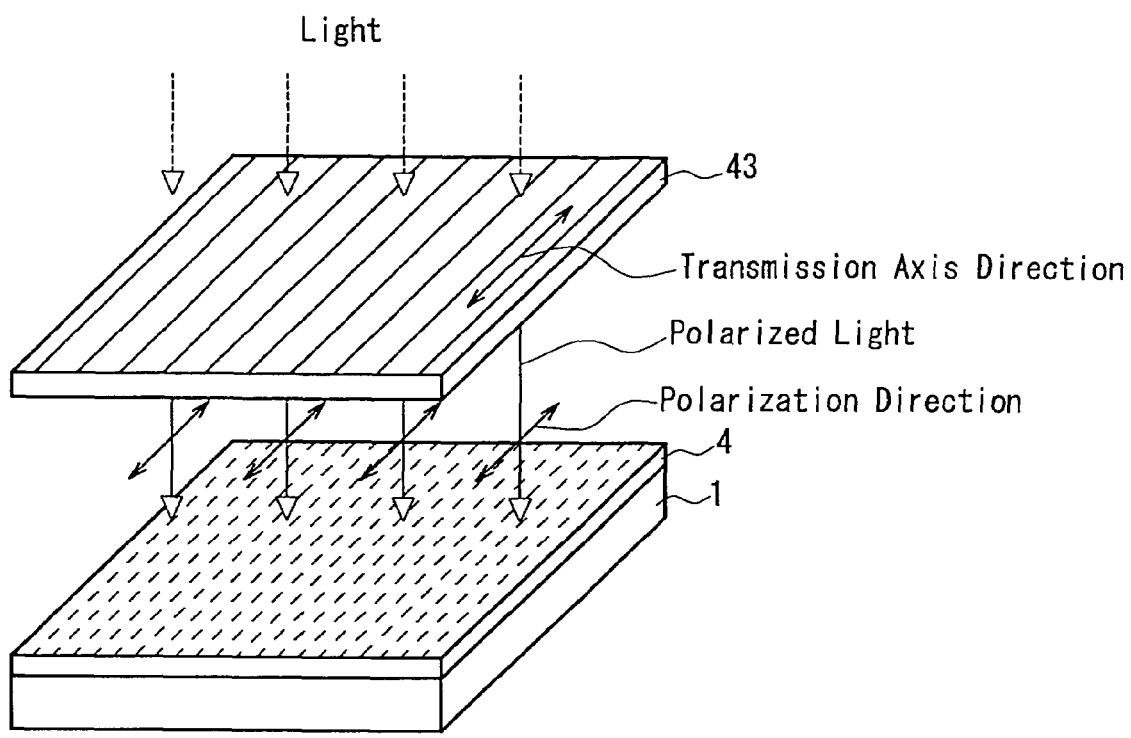
F I G. 3
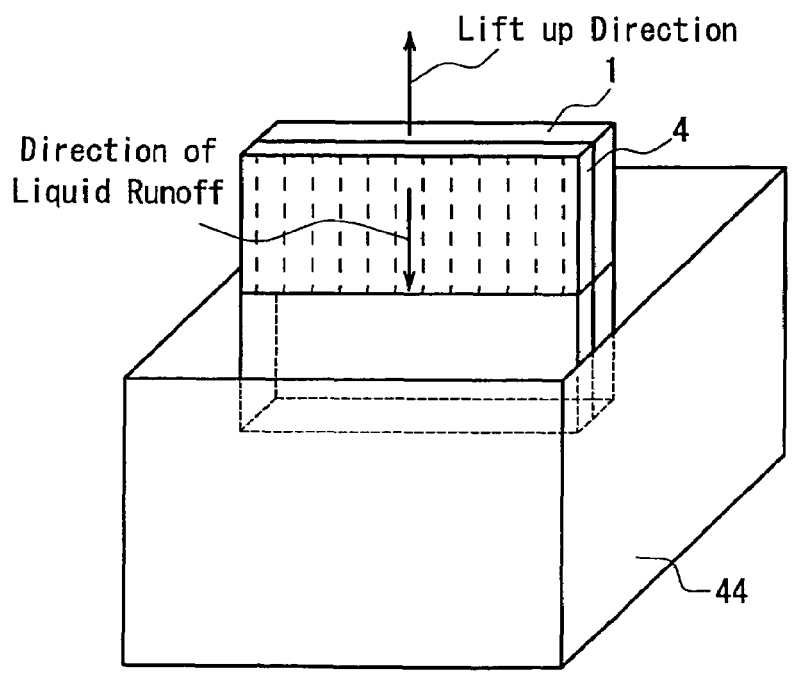
F I G. 4

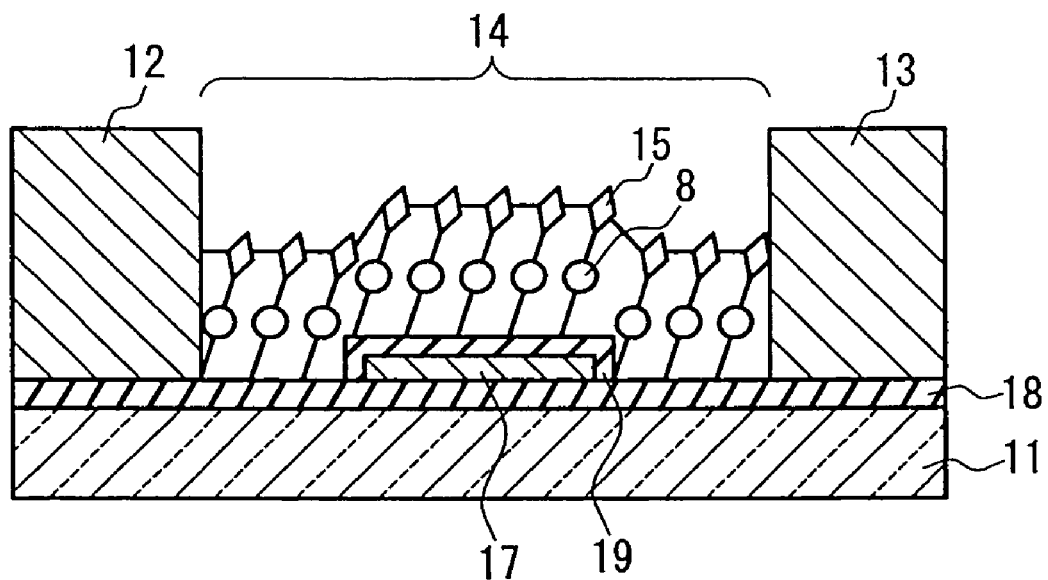
F I G. 6 A
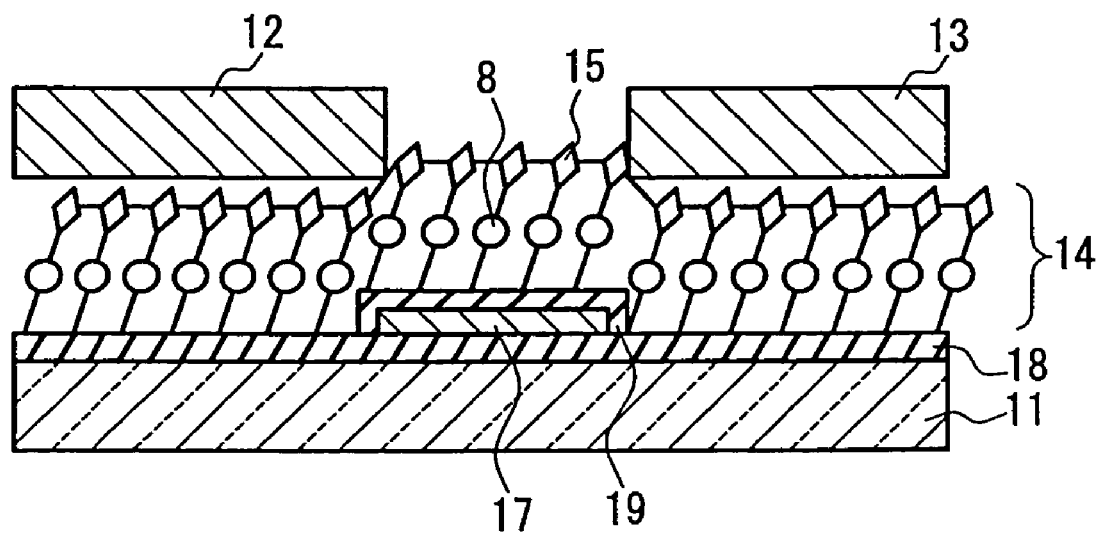
F I G. 6 B

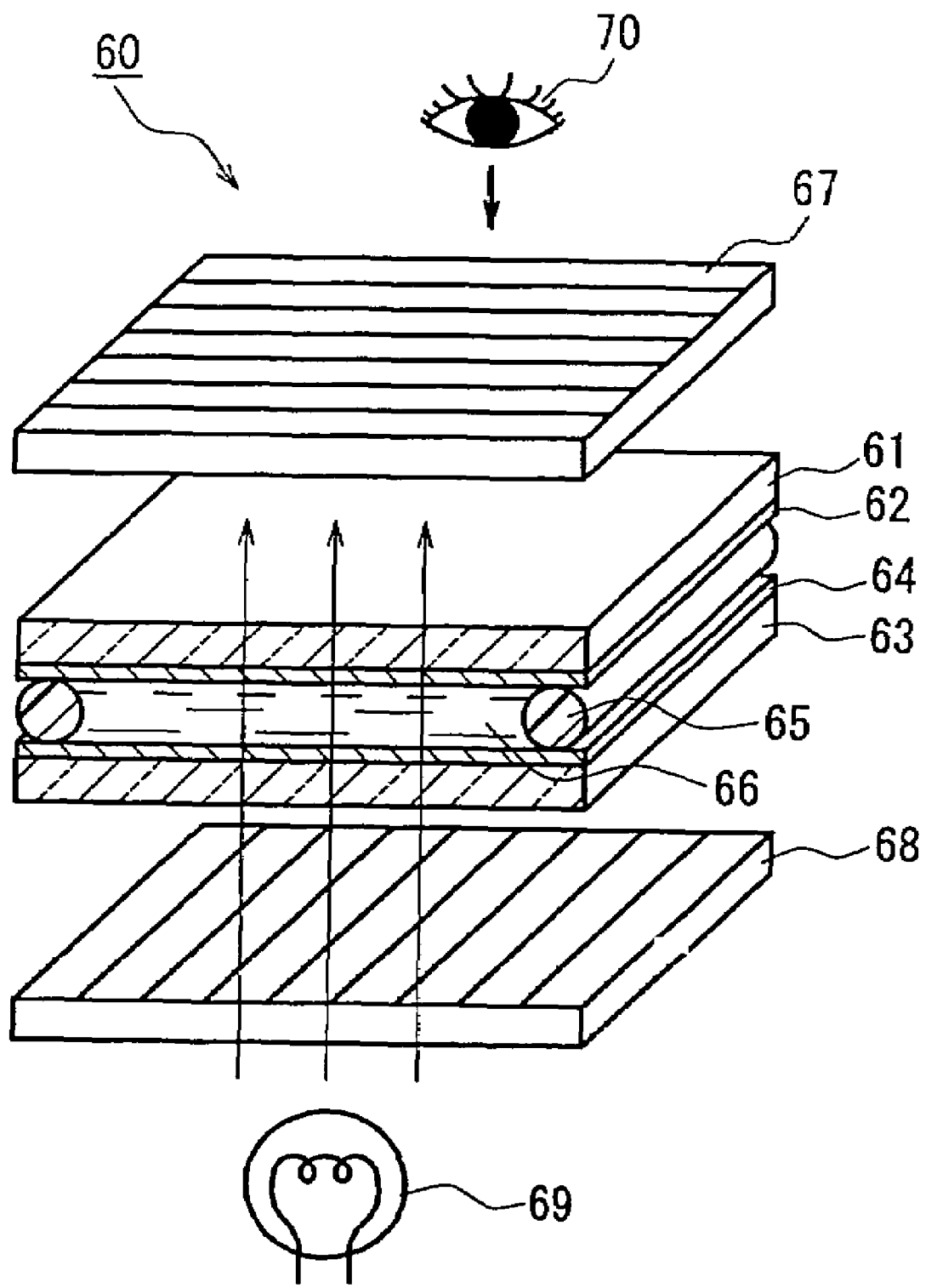
F I G. 14

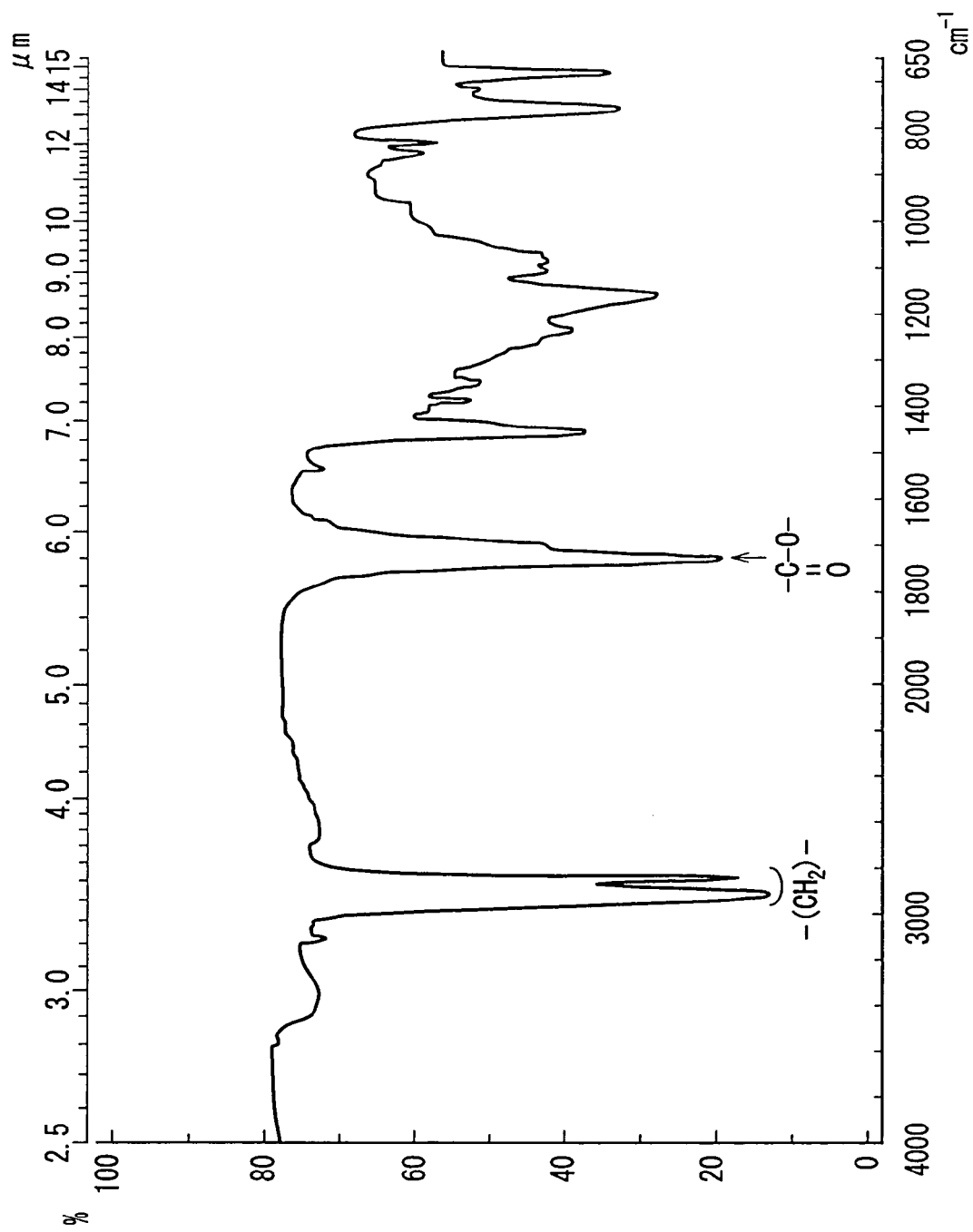
F I G. 1 8

CONDUCTIVE ORGANIC THIN FILM, METHOD FOR MANUFACTURING THE SAME, AND ELECTRONIC DEVICE, ELECTRIC CABLE, ELECTRODE, PYRROLYL COMPOUND, AND THIENYL COMPOUND USING THE SAME

This application is a division of application Ser. No. 10/465,939, filed Dec. 30, 2003.

TECHNICAL FIELD

The present invention relates to conductive organic thin films using organic material, methods for manufacturing the same, and organic electronic devices, liquid crystal display devices, electroluminescence devices, electric cable, electrodes, pyrrolyl compounds, and thienyl compounds using the same. It also relates to organic electronic devices and display devices that use changes in conductivity in monomolecular films, monomolecular stacked films, or thin films having conductivity.

BACKGROUND ART

Various organic conductive films have been proposed in the past. The assignee of this application already has proposed conductive films including conductive conjugated groups such as polyacetylene, polydiacetylene, polyacene, polyphenylene, polythienylene, polypyrrole, and polyaniline, for example (JP H2(1990)-27766A, U.S. Pat. No. 5,008,127, EP-A-0385656, EP-A-0339677, EP-A-0552637, U.S. Pat. No. 5,270,417, JP H5(1993)-87559A, and JP H6(1994)-242352A).

Also, inorganic-based semiconductor materials, a representative example of which is silicon crystal, conventionally have been used in electronic devices. Examples of organic-based electronic devices (hereinafter, organic electronic devices) are disclosed in Japanese Patent No. 2034197 and Japanese Patent No. 2507153, for example. In the organic electronic devices described in these publications, the current flowing between terminals is switched in response to an applied electric field.

In the above-mentioned conventional organic conductive films, there was the problem that their conductivity is lower than that of metal. Furthermore, in the inorganic crystals used conventionally, crystal defects are becoming a problem as miniaturization proceeds, and there was the problem that device performance varies strongly with the crystal. Furthermore, there was the problem that flexibility is poor.

DISCLOSURE OF INVENTION

The present invention was arrived at in light of the foregoing, and it is a first object thereof to provide a conductive organic thin film, and a method for manufacturing the same, that either has conductivity that is greater than that of conventional organic thin films or has conductivity that is on a par with or greater than that of conductive metals such as gold and silver.

A second object of the present invention is to provide a device that is highly integrated, by fabricating a device using an organic substance whose crystallinity is not affected, even if the device is very dense and has been minutely processed to a size of less than 0.1 μm. It is also an object to provide an organic electronic device with excellent flexibility by forming the device on a flexible substrate, for example.

A third object of the present invention is to provide a pyrrolyl compound and a thienyl compound that are effective as the conductive organic thin film.

To achieve the above objects, an conductive organic thin film of the present invention has organic molecules that include, at one end, a terminal bonding group that is covalently bonded to a substrate surface, a conjugate bonding group that is located at any portion of the organic molecules and that is polymerized with other molecules, and a polar functional group that does not include active hydrogen and that is located at any portion between the terminal bonding group and the conjugate bonding group, and the organic molecules are oriented and their conjugate bonding group is polymerized with the conjugate bonding groups of other molecules, forming a conduction network.

Moreover, another conductive organic thin film according to the present invention forms a conductive network in which a group that is covalently bonded to the substrate is polymerized in the direction of a substrate surface, wherein the conductive network is at least one polymer selected from polypyrrole and polythienylene, and a conductivity ($\rho$) of the conductive organic thin film at room temperature (25° C.) is at least $1 \times 10^7$ S/cm without dopants.

Furthermore, a method for manufacturing a conductive organic thin film according to the present invention includes forming an organic thin film, by bringing a compound made of organic molecules including, at one end, a terminal bonding group that can be covalently bonded to a substrate surface, a conjugated bondable group that is located at any portion of the organic molecules and that can be polymerized with other molecules, and a polar functional group that does not include active hydrogen and that is located at any portion between the terminal bonding group and the Conjugated bondable group, into contact with a substrate whose surface has active hydrogen or to which active hydrogen has been added, and covalently bonding the two through an elimination reaction; either orienting the organic molecules making up the organic thin film by tilting them in a predetermined direction or by giving them orientation while polymerizing them in a subsequent polymerization step; and in a polymerization step, conjugatively bonding the conjugated bondable groups to one another by at least one polymerization method selected from polymerization through electrolytic oxidation, catalytic polymerization, and polymerization through energy beam irradiation, so as to form a conduction network.

Furthermore, a three-terminal organic electronic device according to the present invention is provided with a first electrode formed on a substrate, a second electrode that is arranged at a distance from the first electrode, a conductive organic thin film that electrically connects the first electrode and the second electrode, and a third electrode that is sandwiched between the substrate and the conductive organic thin film and that is insulated from these, wherein the third electrode is an electrode that controls an electric field that acts on the conductive organic thin film by the voltage applied between itself and the first electrode or the second electrode, and wherein the conductive organic thin film is made of organic molecules that include at least one selected from a terminal bonding group at an end of the organic molecules that is covalently bonded to the substrate surface, a conjugate bonding group that is located at any portion of the organic molecules and that is polymerized with other molecules, and a polar functional group that does not include active hydrogen and that is located at any portion between the terminal bonding group and the conjugate bonding group, and the organic molecules are oriented and their conjugate bonding groups are polymerized, forming a conduction network.

Furthermore, a liquid crystal display device according to the present invention uses, as a switching element, a three-terminal organic electronic device provided with a first electrode formed on a substrate, a second electrode that is arranged at a distance from the first electrode, a conductive organic thin film that electrically connects the first electrode and the second electrode, and a third electrode that is sandwiched between the substrate and the conductive organic thin film and isolated from these, and is an electrode that controls the electric field that acts on the conductive organic thin film through the application of voltage between itself and the first electrode or the second electrode, wherein the conductive organic thin film is made of organic molecules which include, at one end, a terminal bonding group that is covalently bonded to the substrate surface, a conjugate bonding group that is located at any portion of the organic molecules and that is polymerized with other molecules, and a polar functional group that does not include active hydrogen and that is located at any portion between the terminal bonding group and the conjugate bonding group, wherein the organic molecules are oriented and their conjugate bonding groups are polymerized, forming a conduction network, wherein the liquid display device is provided with an array substrate on which a plurality of the switching elements are arranged in a matrix on the substrate, a first oriented film formed on the surface of the array substrate, a color filter substrate in which color elements are arranged in a matrix on a transparent substrate, a second oriented film formed on a surface of the color filter substrate, and a liquid crystal layer sealed in between the array substrate and the color filter substrate, which are in opposition to one another with the first oriented film and the second oriented film facing inward.

Moreover, an electroluminescence-type display device according to the present invention uses, as a switching element, a three-terminal organic electronic device that is provided with a first electrode formed on a substrate, a second electrode that is arranged at a distance from the first electrode, and a third electrode that electrically connects the first electrode and the second electrode through the conductive organic thin film made of organic molecules that include, at one end, a terminal bonding group that is covalently bonded to the substrate surface, a conjugate bonding group that is located at any portion of the organic molecules and that is polymerized with other molecules, and a polar functional group that does not include active hydrogen and that is located at any portion between the terminal bonding group and the conjugate bonding group, wherein the organic molecules are oriented and their conjugate bonding groups are polymerized, forming a conduction network, wherein the third electrode is sandwiched between the substrate and a conductive organic thin film and insulated from these and controls the electric field that acts on the conductive organic thin film through the voltage applied between itself and the first electrode or the second electrode, wherein the electroluminescence-type display device is provided with an array substrate on which a plurality of the switching elements are arranged in lines in a matrix on a substrate, a common electrode that opposes the array substrate, and a light-emission layer formed between the array substrate and the common electrode, and which includes a light-emitting substance that emits light due to the application of an electric field.

Moreover, an electric cable according to the present invention is provided with a core line, a conductive organic thin film formed in a longitudinal direction of a surface of the core line, and an insulating coating that covers the conductive organic thin film, wherein the conductive organic thin film is made of organic molecules that include, at one end, a terminal bonding group that is covalently bonded to a substrate surface of the core line, a conjugate bonding group that is located at any portion of the organic molecules and that is polymerized with other molecules, and a polar functional group that does not include active hydrogen and that is located at any portion between the terminal bonding group and the conjugate bonding group, and the organic molecules are oriented and their conjugate bonding groups are polymerized through polymerization through electrolytic oxidation, forming a conduction network.

Furthermore, an electrode according to the present invention is transparent with respect to light of wavelengths in the visible radiation region, and the electrode is a conductive organic thin film of organic molecules that include, at one end, a terminal bonding group that is covalently bonded to a substrate surface, a conjugate bonding group that is located at any portion of the organic molecules and that is polymerized with other molecules, and a polar functional group that does not include active hydrogen and that is located at any portion between the terminal bonding group and the conjugate bonding group, wherein the organic molecules are oriented and their conjugate bonding groups are polymerized, forming a conduction network.

Furthermore, a conductive network according to the present invention is expressed by the chemical formula (A) or (B) shown below:

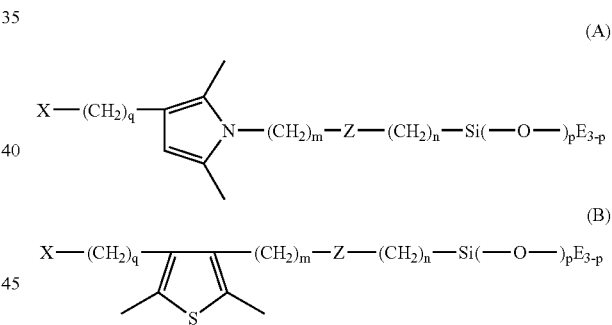

wherein in chemical formulae (A) and (B), X is hydrogen or an organic group including an unsaturated group, q is an integer of 0 to 10, Z is an ester group (—COO—), an oxycarbonyl group (—OCO—), a carbonyl group (—CO—), or a carbonate group (—OCOO—), E is hydrogen or an alkyl group with a carbon number of 1 to 3, m and n are integers with m+n being at least 2 and not more than 25 and preferably at least 10 and not more than 20, and p is an integer of 1, 2, or 3.

Also, a compound according to the present invention is expressed by the chemical formula (C) or (F)) shown below:

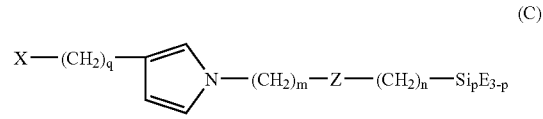

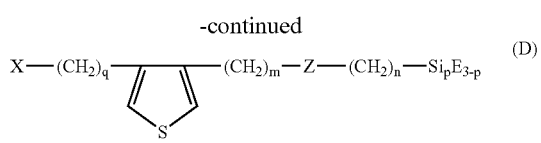

wherein in chemical formulae (C) and (D), X is hydrogen or an organic group including an unsaturated group, q is an integer of 0 to 10, Z is an ester group (—COO—), an oxycarbonyl group (—OCO—), a carbonyl group (—CO—), or a carbonate group (—OCOO—), E is a halogen atom, an isocyanate group, or an alkoxysilyl group with a carbon number of 1 to 3, m and n are integers with m+n being at least 2 and not more than 25 and preferably at least 10 and not more than 20, and p is an integer of 1, 2, or 3.

BRIEF DESCRIPTION OF DRAWINGS

FIG. 3 is a conceptual diagram for describing the light orientation method in the first embodiment of the invention.

FIG. 4 is a conceptual diagram for describing the lift-up orientation method in the first embodiment of the invention.

FIGS. 5A to 5D are conceptual diagrams showing an example of the structure of a monomolecular stacked film according to the third embodiment of the invention magnified up to the molecular level, wherein FIG. 5A is a cross-sectional view of an X-type conductive monomolecular stacked film that has been formed through chemical deposition and in which the monomolecular layers are oriented in the same direction, FIG. 5B is a cross-sectional view of a Y-type conductive monomolecular stacked film in which the second layer and beyond are formed using the Langmuir-Blodgett technique, and in which the monomolecular layers are oriented in the same direction, FIG. 5C is a cross-sectional view of an X-type conductive monomolecular stacked film in which the monomolecular layers have different orientation directions, and FIG. 5D is a cross-sectional view of an X-type conductive monomolecular stacked film in which each monomolecular layer is oriented in one of two orientation directions.

FIGS. 6A and 6B are conceptual diagrams showing the structure of a three-terminal organic electronic device according to the fourth embodiment of the invention magnified to the molecular level, wherein FIG. 6A is a cross-sectional view of a structure in which first and second electrodes are formed on the surface of a substrate with insulating film, and FIG. 6B is a cross-sectional view of a structure in which first and second electrodes are formed on the surface of an organic thin film.

FIG. 7A is a conceptual diagram illustrating the dependency between the conductance of the conduction network and the voltage that is applied to the third electrode, and FIG. 7B is a conceptual diagram describing the switching operation due to whether voltage is applied to the third electrode.

FIG. 14 is a diagram showing the method for evaluating the orientation of the conductive organic molecules according to Working Example 7 of the invention.

FIG. 18 is an IR chart of the thienyl compound obtained in Working Example 2 of the invention.

Figure 1A:
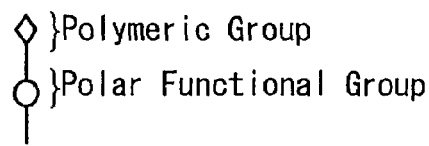
FIG. 1A is a conceptual cross-sectional view showing the conductive monomolecular film formed on the substrate in the first embodiment of the invention magnified to the molecular level.
Figure 1A:
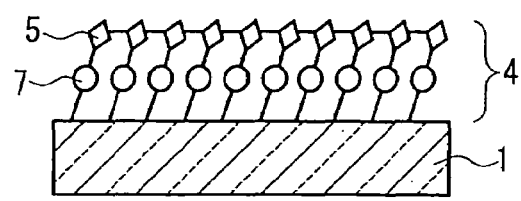

1: substrate, 4: conductive monomolecular film, 5: conduction network, 7: polar functional group that does not contain active hydrogen, 11: substrate, 12: first electrode, 13: second electrode, 14: electric field responsive conductive monomolecular film, 15: conduction network, 17: third electrode, 18: first insulating film, 19: second insulating film, 31: polyimide substrate, 34: electric field responsive monomolecular film, 34a: monomolecular film, 34b: oriented monomolecular film, 34c: conductive monomolecular film, 35: conduction network, 37: third electrode made of aluminum, 38: silica film, 39: alumina film, 41: rubbing cloth, 42: rubbing roll, 43: polarizing plate, 44: organic solvent, 50: electric cable, 51: glass core wire, 52: polypyrrole film obtained through polymerization through electrolytic oxidation, 53: cover insulating film, 60: liquid crystal cell

BEST MODE FOR CARRYING OUT THE INVENTION

In the invention, the organic thin film is given conductivity by the conjugate bonding and polymerization of molecules making up the cluster of organic molecules. Here, the conduction network is a cluster of organic molecules that are bonded to one another in conjugate bonds, which contribute to the transmission of electricity, and is formed as a polymer having a chain of conjugated bonds (a conjugate system). Also, the conduction network is formed in the direction between the electrodes. Strictly speaking, a polymer of a chain of the conjugated bonds does not have to extend in one direction, and it is also possible for polymer chains of various directions to be formed generally between the electrodes.

In the invention, the conductivity ($\rho$) of the conductive organic thin film is at least 1 S/cm, preferably at least $1\times10^3$ S/cm, more preferably at least $1\times10^4$ S/cm, even more preferably at least $5.5\times10^5$ S/cm, and particularly preferably at least $1\times10^7$ S/cm. These above values are all at room temperature (25° C.) without dopants.

It is preferable that the polymerized conjugated bond group is at least one conjugated bond group selected from polypyrrole, polythienylene, polyacetylene, polydiacetylene and polyacene. In particular when the conjugated bond group is polypyrrole or polythienylene and the thin film has been polymerized by electrolytic oxidation, its conductivity is high.

It is preferable that the polar functional group that does not include active hydrogen is at least one group selected from an ester group (—COO—), an oxycarbonyl group (—OCO—), a carbonyl group (—CO—), and a carbonate group (—OCOO—).

It is preferable that the terminal bonding group is at least one bond selected from a siloxane (—SiO—) bond and a —SiN— bond.

It is preferable that the terminal bonding group is formed through at least one elimination reaction selected from a dehydrochlorination reaction and a dealcoholization reaction.

A molecular film formed through this method is referred to as a "chemisorptive film" or a "self-assembling film" by those skilled in the art, and in this invention it is referred to as a "chemisorptive film." Also, the method by which it is formed is referred to as a "chemisorption method."

In accordance with the present invention, it is preferable that the orientation of the molecules is achieved by at least one selected from an orientation process by rubbing, a process of letting a reaction solution run off the tilted substrate surface after covalently bonding the molecules to the substrate surface in an elimination reaction, a process of irradiating polarized light, and orientation by fluctuations of the molecules during the polymerization step.

It is preferable that the conductive region of the organic thin film is transparent to light of a wavelength in the visible region.

It is preferable that a molecular unit forming the conduction network is expressed by a chemical formula (E) or (F), for example, shown below:

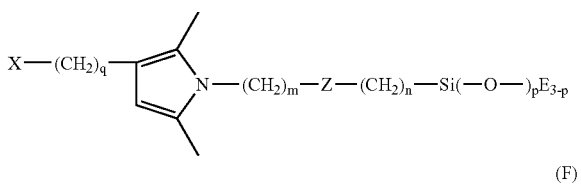

(E)

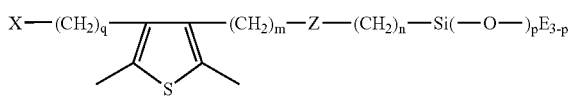

(F)

wherein in chemical formulae (E) and (F), X is hydrogen or an organic group including an unsaturated group, q is an integer of 0 to 10, Z is an ester group (—COO—), an oxycarbonyl group (—OCO—), a carbonyl group (—CO—), or a carbonate group (—OCOO—), D is a halogen atom, an isocyanate group, or an alkoxysilyl group with a carbon number of 1 to 3, E is hydrogen or an alkyl group with a carbon number of 1 to 3, m and n are integers with m+n being at least 2 and not more than 25 and preferably at least 10 and not more than 20, and p is an integer of 1, 2, or 3.

It is preferable that the terminal functional group of the material molecules used in the invention is a chlorosilyl group, an alkoxysilyl group, or an isocyanate group, and that it forms covalent bonds with the active hydrogen of the substrate surface by at least one elimination reaction selected from a dehydrochlorination reaction, a dealcoholization reaction, and a deisocyanate reaction.

It is preferable that the conjugated bondable group is at least one group selected from pyrrole, thienylene, acetylene and diacetylene.

It is preferable that the organic molecules are formed in monomolecular layers.

It is also possible to layer monomolecular layers into a monomolecular stacked film by repeating the monomolecular layer formation step a plurality of times.

In chemical formulae (E) and (F) mentioned above, if X includes an unsaturated group such as a vinyl bond, then an —OH group can be introduced by irradiating an energy beam such as an electron beam or X-rays in an atmosphere in which water vapor is present, for example. Also, if X is an unsaturated group such as a vinyl bond, then a —COOH group can be introduced by immersion in an aqueous solution of potassium permanganate. By doing this, it is possible to introduce active hydrogen, and thus the monomolecular film can be further stacked and bonded.

It is also possible to form a conductive monomolecular stacked film by repeating the monomolecular layer formation step and the tilt processing (orientation) step in alternation, and then collectively forming a conductive network in the various monomolecular layers of the monomolecular stacked film by the conductive network formation step.

It is further possible to form a conductive monomolecular stacked film by repeating a series of steps including the monomolecular layer formation step, the tilt processing step and the conductive network formation step.

The polymerization may be at least one polymerization selected from polymerization through electrolytic oxidation, catalytic polymerization and polymerization through energy beam irradiation. It is also possible to perform at least one pre-polymerization selected from catalytic polymerization and polymerization through energy beam irradiation, before forming the conductive network by electrolytic oxidation.

It is preferable that the energy beam is at least one selected from ultraviolet radiation, far ultraviolet radiation, X-rays, and an electron beam.

It is also possible that the energy beam is at least one selected from polarized ultraviolet radiation, polarized far ultraviolet radiation, and polarized X-rays, and that the tilting/orientation and formation of the conduction network are performed at the same time.

When the organic molecules include functional groups having polarity, then the sensitivity with respect to the applied electric field becomes high, and the speed of response becomes fast. Consequently, the conductivity of the organic thin film can be changed quickly. It seems that the change of the conductivity of the organic thin film when applying an electric field occurs because the functional groups with polarity respond to the electric field, and the effect of this response affects the structure of the conductive network.

Furthermore, when a dopant substance with carrier mobility is incorporated in the conductive network by doping, then the conductivity can be increased even more. As dopant substances, it is possible to use iodine, $BF^-$ ions, alkali metals such as Na or K, alkali earth metals such as Ca or any other suitable dopant substance. It is also possible to include dopant substances by contaminants that are unavoidably admixed in trace amounts included in the solution of the organic film formation step or from the glass container.

In another example, the conductance of the conduction network changes in correspondence with the intensity of an electric field when an electric field is generated within an electric field responsive conductive organic thin film. Consequently, the conductance of the conduction network is different when an electric field is not acting on the conductive organic thin film and when an electric field of a predetermined intensity is acting on the conductive organic thin film. Therefore, by turning the electric field on and off it is possible to perform switching control of the conductance of the conduction network.

Also, when a first electric field or a second electric field of different intensity is applied to the organic thin film, the conductance of the conduction network becomes a first conductance or a second conductance, respectively. Thus, the state is moved between a stable state having the first conductance and a stable state having the second conductance, allowing the conductance of the conduction network to be switched.

Since the organic molecules constituting the conductive monomolecular layer are in a relatively well oriented state, the chains of conjugated bonds of the conductive network are within a certain plane. Consequently, the conductive network formed in the monomolecular layer is linearly linked in a predetermined direction. Due to the linearity of this network, it has a high conductive anisotropy. Furthermore, the linearity of the conductive network means that the chains of conjugated bonds (conjugated systems) constituting the conductive network are arranged substantially parallel within the same plane in the monomolecular layer. Consequently, the conductive monomolecular layer has a high and uniform conductance. Furthermore, due to the linearity of the conductive network, it has conjugated bond chains with a high polymerization degree in the monomolecular layer According to another example, it is possible to provide a conductive monomolecular film and a conductive monomolecular stacked film that are thin yet have extremely good conductivity. Also, the change in the conductivity of these is extremely fast.

In the case of a conductive monomolecular stacked film, the conductive networks are formed in the conductive monomolecular layers, so that the conductance of the conductive network of the monomolecular stacked film depends on the number of layered monomolecular films. Consequently, by changing the layered number of conductive monomolecular layers, a conductive organic thin film can be provided that has a desired conductance. For example, with a conductive stacked film in which the same conductive monomolecular layers are layered, the conductance of the conductive network included therein is substantially proportional.

As long as the directions of the conductive networks formed in all monomolecular layers in the conductive monomolecular stacked film are the same, the tilt angle of the orientation of the organic molecules can be different for each monomolecular layer. Furthermore, it is also possible that not all monomolecular layers are made of the same organic molecules. Furthermore, a conductive monomolecular stacked film made of different kinds of organic molecules at each conductive monomolecular layer is also possible.

Furthermore, in the case of a conductive monomolecular stacked film, when the conductive monomolecular layer nearest to the substrate material is bonded to the substrate material by chemical bonds, the durability characteristics, such as peeling, are excellent.

According to another example, it is possible to manufacture an electric field responsive conductive organic thin film provided with conduction networks that have directionality. In general, the direction of the conduction networks is the same as the tilt direction of the organic molecules making up the organic thin film after the tilting step. As long as conduction networks having directionality are formed, their direction does not have to be the same as the direction in which the organic molecules are tilted.

Here, the tilt direction of the organic molecules in the tilt processing step means the direction of the segment obtained by projecting the long axis of the organic molecules onto the surface of the substrate material. Consequently, the tilt angle with respect to the substrate material does not have to be one uniform angle.

According to another example, it is possible to form an organic thin film having a monomolecular layer. Moreover, the cluster of organic molecules constituting the monomolecular layer can be tilted in a predetermined direction with high precision in the tilt processing step. Generally, the molecules constituting the monomolecular layer can be oriented. By orienting them with high precision, a conductive network with directionality can be formed easily in the conductive network formation step.

Moreover, when conjugated bonding is achieved between the organic molecules that have been oriented in the monomolecular layer, then a conductive network can be formed, that has a high polymerization degree and that is linearly linked. Moreover, due to the linearity of the conductive network, it is possible to form a uniform conductive monomolecular layer.

In another configuration, polarized light of a wavelength in the visible region is used for the above-mentioned polarized light. With this configuration, peeling of the organic molecules constituting the organic thin film and destruction of the organic thin film through destruction of the organic molecules themselves can be prevented or suppressed.

In another configuration, when an organic thin film is formed on the surface of a substrate material that has been subjected to a rubbing process, then the organic molecules constituting this organic thin film become tilted in a predetermined direction. In general, the rubbing direction in the rubbing process and the tilt direction of the formed organic molecules will be the same.

For the rubbing cloth used in the rubbing process, it is possible to use a cloth made of nylon or rayon. Using a rubbing cloth made of nylon or rayon is consistent with the object of improving the precision of the orientation.

In the conductive network formation step, one or more polymerization methods may be applied, and the conductive network may be formed by conjugated bonds by polymerizing the molecules constituting the organic thin film or by polymerization followed by cross-linking. With this configuration, a conductive network can be formed, in which the polymerizable groups of the organic molecules are linked by conjugated bonds and electric conductance becomes possible. For the polymerization, at least one polymerization method selected from polymerization through electrolytic oxidation, catalytic polymerization and polymerization through energy beam irradiation may be utilized. In particular if the conductive network is concluded by polymerization through electrolytic oxidation in the final step, a high conductivity can be attained.

Moreover, if the molecules forming the organic thin film have a plurality of polymerizable groups that can be bonded together by conjugated bonds, then, by further subjecting the polymer molecules formed in the polymerization of some polymerizable groups to a cross-linking reaction and bonding them to other polymerizable groups by conjugated bonds, it is possible to form a conductive network having a structure that is different from the structure after polymerization. Herein, the other polymerizable groups that are in the side chains of the polymer molecules formed by polymerization are cross-linked.

For example, if a monomolecular film made of a cluster of organic molecules having a diacetylene group is formed, the monomolecular film is subjected to a catalytic polymerization, and then cross-linking is performed by polymerization through irradiation with an energy beam, then a conductive network can be formed that includes polyacene-based conjugated systems with extremely high conductance.

In the step of performing this polymerization, it is also possible to apply a polymerization method selected from the group consisting of catalytic polymerization, electrolytic polymerization, and energy beam polymerization. In this example, it is possible to form a conductive network by applying catalytic polymerization on an organic thin film made of organic molecules including polymerizable groups that are polymerizable by catalytic polymerization (referred to as catalytic polymerizable groups in the following), or by applying electrolytic polymerization on an organic thin film made of organic molecules including polymerizable groups that are polymerizable by electrolytic polymerization (referred to as electrolytic polymerizable groups in the following), or by applying energy beam polymerization on an organic thin film made of organic molecules including polymerizable groups that are polymerizable through irradiation with an energy beam (referred to as energy beam polymerizable groups in the following). To form the conductive network efficiently, is possible to first perform catalytic polymerization and/or energy beam polymerization, and conclude the reaction by polymerization through electrolytic oxidation in the final step.

If the cross-linking step is performed a plurality of times, then it is possible to combine cross-linking steps with different operative effects, but it is also possible to combine steps with the same operative effect but different reaction conditions. For example, it is possible to form a conductive network by performing a cross-linking step by catalytic action, then a cross-linking step based on irradiation of a first type of energy beam, and then a cross-linking step based on irradiation of a second type of energy beam.

In the conductive network formation step, catalytic polymerization may be applied as the polymerization method, and the conductive network may be formed in an organic thin film made of a cluster of organic molecules having, as the polymerizable group, a pyrrole group, a thienylene group, an acetylene group or a diacetylene group.

For example, a conductive network including polypyrrole-type conjugated systems may be formed using organic molecules including a pyrrole group, or a conductive network including polythienylene-type conjugated systems may be formed using organic molecules including a thienylene group.

In the conductive network formation step, it is also possible to apply energy beam polymerization, and to form a conductive network in an organic thin film made of a cluster of organic molecules having an acetylene group or a diacetylene group as the polymerizable group. With this configuration, a conductive network including polyacetylene-type conjugated systems can be formed using, as the organic molecules constituting the organic thin film, organic molecules having an acetylene group. Moreover, using organic molecules having a diacetylene group, it is possible to form a conductive network including polydiacetylene-type conjugated systems or polyacene-type conjugated systems.

As the energy beam, it is possible to use ultraviolet radiation, far ultraviolet radiation, X-rays, or an electron beam. With this example, the conduction network can be formed efficiently. Also, because the absorption properties are different for each type of group that is polymerized through beam irradiation, the reaction efficiency can be increased by selecting the type of energy beam and the energy at which the absorption efficiency is good. Moreover, because many of the polymeric groups polymerized by the irradiation of an energy beam absorb these energy beams, the energy beams can be adopted for organic thin films made of organic molecules having various types of polymeric groups that are polymerized by the irradiation of energy beams.

Also, the energy beam can be polarized ultraviolet radiation, polarized far ultraviolet radiation, or polarized X-rays, and the tilting step and conduction network formation step can be performed at the same time. With this configuration, the organic molecules constituting the organic thin film can be tilted (oriented) in a predetermined direction, while at the same time bonding the organic molecules to one another with conjugated bonds. Consequently, the process can be simplified.

The conductance between the first electrode and the second electrode is greatest when they are arranged in an array in the direction of the conduction network, and the conductance is the smallest when they are arranged perpendicular to the direction of the conduction network. If the first electrode and the second electrode are formed in a state where the conductance is greatest, then it is possible to provide a three-terminal electronic device in which the range of the change in conductance is large.

If the layout direction between the first electrode and the second electrode is adjusted as they are arranged, then it is possible to adjust the conductance between the electrodes. Also, by adjusting the size of the electrodes or by adjusting the distance between the electrode pair, the range of the change in conductance also can be adjusted.

According to the three-terminal organic electronic device of the present invention, it is possible to provide a three-terminal organic electronic device in which the channel portion that electrically connects the first electrode and the second electrode is formed by the conductive organic thin film and the conductance between the first electrode and the second electrode (electrode pair) is changed by applying an electric field. Also, by giving the organic molecules making up the conductive thin film a polar functional group, their sensitivity to an applied electric field is high and they have a fast response speed. Consequently, a three-terminal organic electronic device in which the conductance between the electrode pair is changed very quickly can be provided.

The conductance between the electrodes is largest when the first electrode and the second electrode are arranged in an array in the direction of the conduction network, and the conductance is smallest when they are arranged in an array in a direction perpendicular to the direction of the conduction network. If the first electrode and the second electrode are formed in a state where the conductance is of a maximum, then a three-terminal organic electronic device in which the range of variation in the conductance is large can be provided.

If the layout direction of the electrode pair is adjusted when the first electrode and the second electrode are arranged, then the conductance between the electrode pair can be adjusted. Also, by adjusting the size of the electrodes or the distance between the electrode pair, it is possible to adjust the region within which the conductance varies.

The conductance of the conduction network can also be changed by the electric field that is applied to the conductive organic thin film. According to this example, the electric field that is applied to the conductive organic thin film can be controlled by the voltage that is applied between the third electrode and the first electrode or the second electrode. Consequently, if the first electrode and the second electrode are set to different fixed potentials, then the current that flows between the electrode pair can be controlled by the voltage that is applied to the third electrode.

The polar functional group can be a polar function group in which the polarity is increased due to the application of an electric field.

With this configuration, when the polar functional group is a functional group in which the polarity becomes larger by applying an electric field (hereinafter, a "polar functional group"), the sensitivity to changes in the electric field becomes extremely high and this leads to very fast response speeds.

The polar functional group is in particular preferably a carbonyl group, an oxycarbonyl group, an ester group, or a carbonate group. When such a functional group is used, it is possible to provide a three-terminal organic electronic device in which the rate of response to changes in the electric field is extremely fast.

The first electrode and the second electrode can be arranged in an array in the direction of the conduction network. According to this example, if the spacing between the electrode pair is fixed and the first electrode and the second electrode are arranged in an array in various directions, then the conductance between the electrode pair can be set to a maximum value. Consequently, it is possible to provide an organic electronic device in which the range of fluctuation in the conductance between the electrode pair is large.

It is also possible for the conductive organic thin film to be a conductive monomolecular layer in which the organic molecules are arranged in an array in a monomolecular layer and a conduction network is formed in this monomolecular layer. According to this example, it is possible to provide a conductive organic thin film that includes a conductive monomolecular layer having a conduction network with excellent conductivity and conduction anisotropy and that is highly polymerized.

The conductive organic thin film can be a conductive monomolecular film made of a single conductive monomolecular layer that is fixed onto a substrate, or it can be a conductive monomolecular stacked film made of conductive monomolecular layers that are stacked on one another and fixed to a substrate. According to this example, it is possible to provide a conductive monomolecular film and a conductive monomolecular stacked film having excellent conductivity even at a low film thickness. Also, in the case of a conductive monomolecular stacked film, a conduction network is formed in each conductive monomolecular layer, so that the conductance of the conduction network of the monomolecular stacked film depends on the number of layers in the monomolecular film. Consequently, a conductive organic thin film having a desired conductance can be provided by altering the number of conductive monomolecular layers. For example, in the case of a conductive stacked film in which identical conductive monomolecular layers have been layered, the conductance of the conduction networks is substantially proportional.

In a conductive monomolecular stacked film, as long as the direction of the conduction networks formed in all of the monomolecular layers is the same, then it is possible for the slope angle of the orientation of the organic molecules to be different for each monomolecular layer. Also, all the monomolecular layers do not have to be made of identical organic molecules. Moreover, the conductive monomolecular stacked film may also be made of various types of organic molecules that are different for each conductive monomolecular layer.

The conduction monomolecular film or the conductive monomolecular film can be fixed onto a substrate. When the conductive monomolecular layer that is closest to the substrate at this time is chemically bonded to the substrate, excellent resistance to peeling is achieved.

The substrate may be an electrically insulating substrate, for example made of glass or a resin film, or a substrate with an insulating film, that is, a substrate having an insulating film formed on a suitable substrate surface. If the substrate is made of glass or a polyimide resin, then it has active hydrogen at its surface, so that it can be used in unaltered form. If it is a substrate with little active hydrogen, then it may be furnished with active hydrogen by processing it with $SiCl_4$, $HSiCl_3$, $SiCl_3O—(SiCl_2—O)_n—SiCl_3$ (where n is an integer of not less than 0 and not more than 6), $Si(OH)_4$, $HSi(OH)_3$, or $Si(OH)_3O—(Si(OH)_2—O)_n—Si(OH)_3$ (where n is an integer of at least 0 and not more than 6), for example, forming a silica film or activating the substrate surface by corona discharge or plasma irradiation, for example.

If the substrate is an electrically insulating substrate, then there is little leakage current, and an organic electronic device with superior operation stability can be provided.

The organic conductive film of the present invention has high conductivity and high transparency. Conceivable applications making use of these characteristics are conductors, motors, generators, capacitors, transparent electrodes (replacing ITO), semiconductor device wiring/CPU wiring (no heat is generated due to the low resistance), electromagnetic shields, CRT glass surface filters (with prevention of static electricity), and so forth.

First Embodiment

Figure 1B:
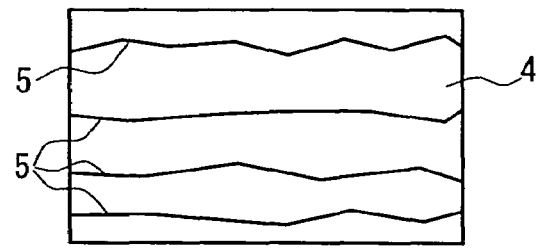
FIG. 1B is a plan view thereof.
Figure 12:
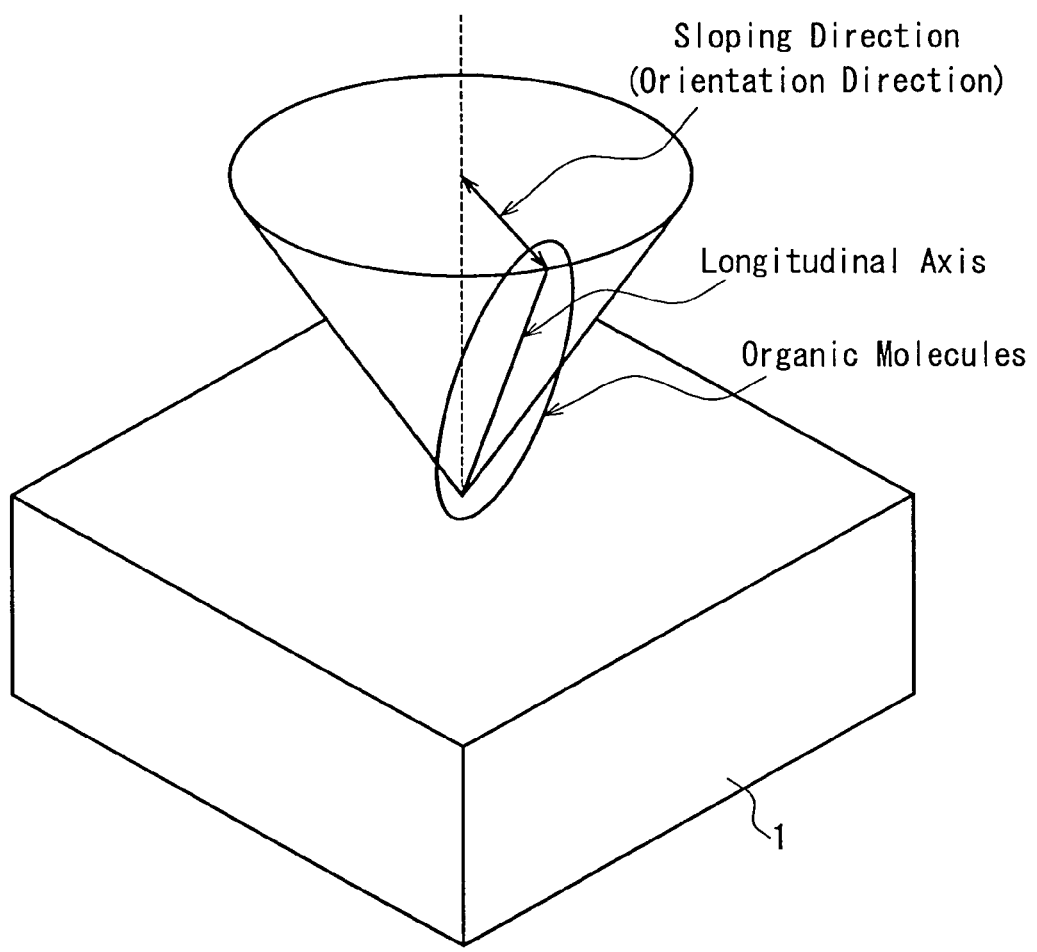
FIG. 12 is a conceptual perspective view for describing the direction in which the organic molecules are tilted in the first embodiment of the invention.

In the first embodiment, with a conductive monomolecular film serving as an example, the method for manufacturing the conductive monomolecular film and its structure are described with reference to FIGS. 1 to 4. FIG. 12 is a conceptual diagram for describing the direction in which the organic molecules are tilted, and shows that the organic molecules bonded to a substrate 1 rotate easily at their polar functional group and are easily orientated. FIGS. 1A and 1B are conceptual diagrams showing the conductive monomolecular film formed on the substrate at a magnification to the molecular level. FIG. 1A is a cross-sectional view and FIG. 1B is a plan view.

(1) Step for Fixing the Organic Molecules to the Substrate Surface

First, a monomolecular film 4 made of organic molecules having a polar functional group 7 that does not include active hydrogen (for example, an oxycarbonyl group (—OCO—)) and a polymeric group 5 that is bonded through conjugate bonding (for example, a 1-pyrrolyl group ($C_4H_4N$—)) is formed on the substrate 1, whose surface has, or has been given, active hydrogen (film formation step, monomolecular layer formation step). When the polar functional group 7 includes active hydrogen, there is the problem that a reaction within the molecule (self-condensation) occurs with the chlorosilyl group at the molecule terminal, which is described below.

When the organic molecules have terminals with a functional group that adheres to the substrate through chemisorption, such as a silane-based surfactant or the like with a chlorosilyl group or a alkoxysilyl group, then an elimination reaction due to a dehydrochlorination reaction or a dealcoholization reaction with the active hydrogen of the substrate surface occurs, bonding and fixing the organic molecules to the substrate and allowing a monomolecular film with good resistance to peeling and good durability to be formed. Also, a monomolecular film 4 whose surface is free of contaminants can be formed if a step for immersing the film in an organic solvent to wash away organic molecules that are not adhered (hereinafter, also referred to as the "washing step") is performed after the monomolecular layer formation step.

(2) Orientation Step

Next, the organic molecules making up the monomolecular film are oriented in a predetermined direction. The methods described below are used to achieve this orientation.

(i) Rubbing

Figure 2:
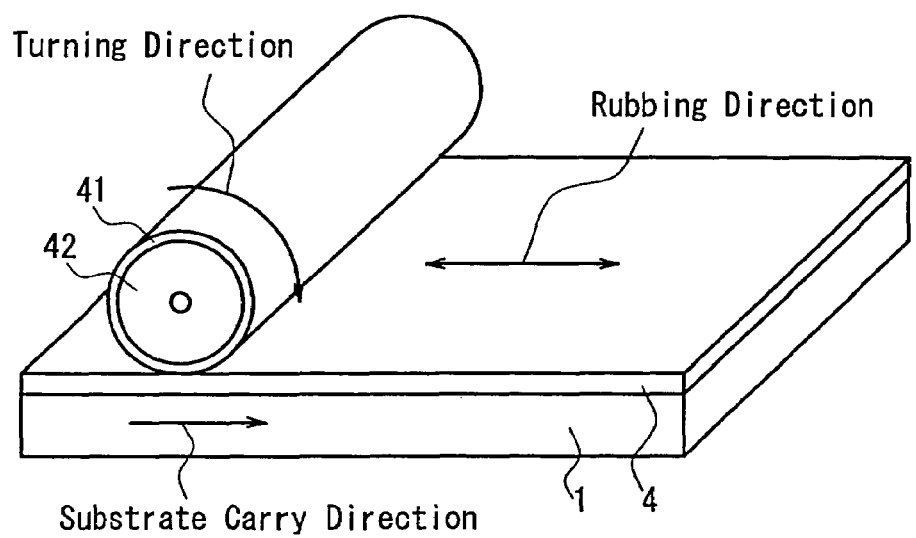
FIG. 2 is a conceptual diagram for describing the rubbing orientation method in the first embodiment of the invention.

In the tilting step, as shown in FIG. 2, a rubbing device can be used to rub the surface of the monomolecular film and orient the organic molecules making up the monomolecular film in the rubbing direction. In FIG. 2, the reference numeral 41 denotes a rubbing cloth and 42 denotes a rubbing roller.

(ii) Polarization

As shown in FIG. 3, a polarizing plate 13 can be used to irradiate polarized light so as to orient the organic molecules making up the monomolecular film 4 in the direction of the polarized light. It is preferable that the polarized light is linearly polarized light. Orientation can be carried out with good precision if these orientation methods are employed.

Also, if rubbing is performed in a pre-processing step with respect to the substrate surface using a rubbing device prior to the monomolecular layer formation step, then a monomolecular film that is oriented can be formed on the substrate, which has been subjected to the rubbing, in the monomolecular film formation step. The orientation direction at this time is identical to the rubbing direction.

(iii) Orientation by Letting a Liquid Run Off the Surface

As shown in FIG. 4, after non-adhered organic molecules have been removed in the above-mentioned washing step, the substrate is maintained at a predetermined slope angle with respect to the liquid surface of an organic solvent 44 as it is lifted up, so as to orient the organic molecules making up the monomolecular film in the direction in which the liquid runs off (hereinafter, this is referred to as "orientation by letting liquid run off the surface").

(iv) Orientation due to the Rocking of the Molecules within the Solution in the Polymerization Step In addition to the three orientation methods described above, orientation also may be achieved by utilizing the rocking of the molecules in the catalytic polymerization and/or the polymerization through an electrolytic oxidation step. The organic molecules used in the present invention include polar functional groups in an internal portion, so that in solution the molecules are prone to rocking, such as rotating, even at room temperature (25° C.). Thus, it is possible to use the orientation caused by the rocking of the molecules in the polymerization through an electrolytic oxidation step, for example.

The four orientation methods mentioned above can be used alone or a plurality of these orientation methods can be used. When different orientation methods are used together in order to form a monomolecular film that is oriented precisely, it is preferable that the rubbing direction, the polarizing direction, and/or the liquid runoff direction are the same direction.

(3) Conduction Network Formation Step

Next, a conduction network is formed by conjugatively bonding the molecules making up the monomolecular film.

Any method may be used for this as long as a conjugate system is formed by the polymerization of polymeric groups that bond in conjugate bonds. The conjugate system can be formed by polymerizing or cross-linking the molecules making up the monomolecular film to one another. The polymerization method may be catalytic polymerization, electrolytic polymerization, and polymerization through energy beam irradiation, for example, and the polymerization method can be used to carry out polymerization or cross-linking. Of these methods, using catalytic polymerization and polymerization by energy beam irradiation to form a preliminary network allows the network to be formed efficiently because polymerization is advanced quickly in these methods.

If the group that can be conjugatively bonded is an ethynyl group (including an acetylene group), then catalytic polymerization and/or electron beam polymerization can be used to polymerize the molecules into polyacetylene.

If the group that can be conjugatively bonded is a diethynyl group (including a diacetylene group), then catalytic polymerization and/or photopolymerization can be used to polymerize the molecules into polyacetylene or polyacene.

If the group that can be conjugatively bonded is a pyrrole group or a thiophene group, then catalytic polymerization and/or polymerization through electrolytic oxidation can be used to polymerize the molecules into polypyrrole or polythiophene. It is particularly preferable that polymerization through electrolytic oxidation is performed in the final step to complete the conduction network. Polymerization through electrolytic oxidation for example can be carried out at a reaction temperature of about room temperature (25° C.), without a catalyst, by applying an electric field and in pure aqueous solution. Of course, the reaction temperature can be suitably raised or lowered, catalysts may be used, and a solution other than an aqueous solution can be used, for example. With polymerization through electrolytic oxidation, polymerization is carried out by applying an electric field between the electrodes, and thus whether the conduction network is complete can be determined easily by observing the status of conduction between the electrodes. That is, a sudden flow of current through the film between the electrodes can be observed if the conduction network is complete.

The conduction network also can be formed by performing the polymerization or cross-linking step a plural number of times. For example, if organic molecules having a plurality of polymeric groups that bond to one another through conjugative bonding are used as the molecules serving as the material for the film, then the conduction network can be formed in a plurality of planes included in the monomolecular layer made of the organic molecules. Also, different polymerization methods may be used each time if polymerization or cross-linking is performed a plural number of times.

If the organic molecules making up the monomolecular film have polymeric groups that are polymerized by the irradiation of an energy beam, then by irradiating polarized light, the monomolecular film can be given orientation and the conduction network can be formed simultaneously.

In this embodiment, when the polar functional groups 7 are in an intermediate portion of the molecules, the molecules easily rotate about that portion, so that the conductive groups 5 are easily oriented in a certain direction when the orientation step is performed and the conductive groups 5 of other molecules draw near one another and are polymerized when polymerization through electrolytic oxidation is performed in the final step, making it easier to form macromolecules.

FIGS. 1A and 1B show the molecular film 4 obtained as above, and show how the molecules are covalently bonded to the substrate 1 and the conductive groups 5 are polymerized in conjugate bonds to form a conduction network.

Second Embodiment

The molecules serving as the material forming the monomolecular film can be organic molecules having a polar functional group that does not contain active hydrogen, such as at least one polar functional group selected from an ester group (—COO—), a carbonyl group (—CO—), and a carbonate group (—OCOO—). Apart from this, the monomolecular film made of a cluster of organic molecules having a polar functional group can be produced in the same fashion as in the first embodiment described above, and is an electric field responsive conductive monomolecular film that has, in each monomolecular layer, a conductive network that extends in a predetermined direction and that is made of the molecules of the cluster of organic molecules conjugatively bonded to one another.

Third Embodiment

The third embodiment describes the manufacturing method and the structure of an electric field responsive conductive organic thin film in a case where it is a monomolecular stacked film. FIGS. 5A to 5D are referred to where necessary.

First, the method for manufacturing the conductive monomolecular stacked film is described. The conductive monomolecular stacked film is formed primarily through the following three methods.

(1) In a first manufacturing method, the steps for forming a monomolecular layer are performed repeatedly so as to create layers of the monomolecular layers, the monomolecular layers are subsequently orientated collectively in a predetermined direction, and then conduction networks are formed in the monomolecular layers.

2) In a second manufacturing method, the steps for forming a monomolecular layer and providing orientation to the monomolecular layers are performed repeatedly so as form a monomolecular stacked film that is oriented, and then a conduction network is formed collectively in each monomolecular layer of the oriented monomolecular stacked film.

(3) In a third manufacturing method, a cycle of forming monomolecular layers, providing orientation to those monomolecular layers, and then forming conduction networks in those monomolecular layers is performed repeatedly.

The same methods as those of the first embodiment can be used to give orientation to the monomolecular layers and to form conduction networks within the monomolecular layers. However, the method for providing orientation is an orientation method that is effective only prior to polymerization.

It is preferable that the above-described three manufacturing methods are used appropriately depending on what method is used to provide orientation to the monomolecular layers and what method is used to form the conduction networks, for example. Furthermore, it is preferable that the manufacturing method used is chosen based on how many conductive monomolecular layers are to be formed in the conductive monomolecular stacked film, for example.

If a conductive monomolecular stacked film with numerous layers is formed, then it is preferable that the second manufacturing method or the third manufacturing method is adopted. With the first manufacturing method, it is difficult to keep the conductivity uniform among the monomolecular layers.

If the first manufacturing method is employed, then it is preferable that orientation is provided through a light-based orientation method or a rubbing orientation method, and that the polymerization method is either polymerization through energy beam irradiation or electrolytic polymerization. Furthermore, the use of a light-based orientation method becomes increasingly effective as the number of layers increases. When a catalytic polymerization method is adopted as the polymerization method, it becomes difficult to form conduction networks in the monomolecular layer serving as the primer layer on the substrate side.

The same effects are achieved with the second manufacturing method as with the first manufacturing method, however, because of the additional steps for providing orientation, it is easy to adopt a light-based orientation method in the orienting step (tilting step), and this is preferable.

If the third manufacturing method is adopted, then all orientation methods and polymerizing methods are possible. The large number of steps in the third manufacturing method lowers the manufacturing efficiency and increases the manufacturing costs, however, it allows a conductive monomolecular stacked film made of monomolecular layers with excellent conductivity and in which there is excellent uniformity in conductivity among the monomolecular layers to be formed.

Through the above series of steps, it is possible to manufacture a electric field responsive conductive monomolecular film made of a cluster of organic molecules with a functional group that responds to electric fields, and that has a conductive network that is formed through the conjugate bonding of the molecules making up the cluster of organic molecules and that extends in a predetermined direction.

Figure 5A:
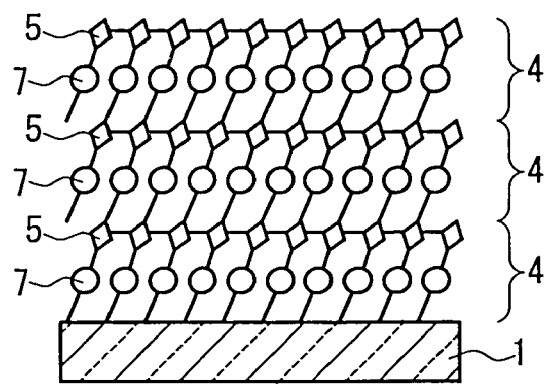
Figure 5B:
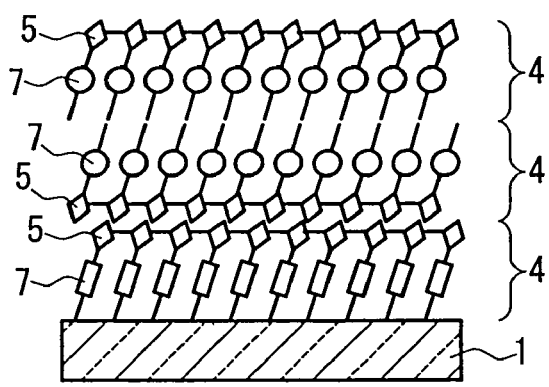
Figure 5C:
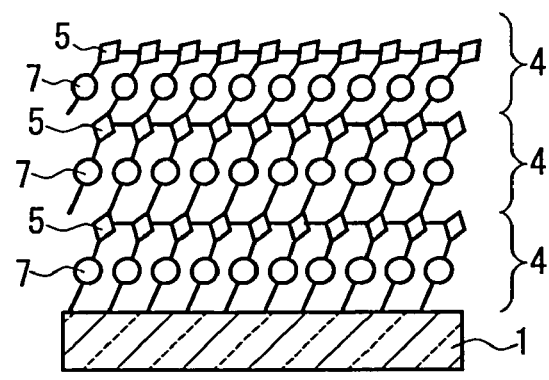
Figure 5D:
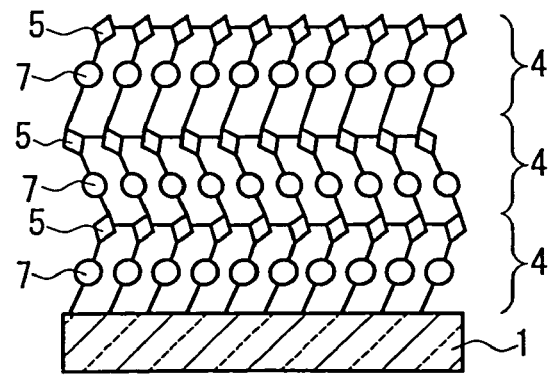

Next, examples of the structure of the conductive monomolecular stacked film formed as above are shown in FIGS. 5A to 5D. FIGS. 5A to 5D are conceptual diagrams showing examples of the structure of the monomolecular stacked film enlarged to the molecular level. FIG. 5A is a cross-sectional view of an X-type conductive monomolecular stacked film that has been formed through chemisorption and in which the monomolecular layers are oriented in the same direction. FIG. 5B is a cross-sectional view of a Y-type conductive monomolecular stacked film in which the first layer is a film formed through chemisorption and the second layer and thereafter films are formed using the Langmuir-Blodgett technique, and in which the monomolecular layers are oriented in the same direction. FIG. 5C is a cross-sectional view of an X-type conductive monomolecular stacked film in which all layers have been formed through chemisorption and in which the monomolecular layers have been given different orientation directions. FIG. 5D is a cross-sectional view of an X-type conductive monomolecular stacked film in which all layers have been formed through chemisorption and in which each monomolecular layer is oriented in one of two orientation directions. In FIGS. 5A to 5D, the reference numeral 1 denotes the substrate, 4 denotes a monomolecular layer, 5 denotes a conductive group that is conjugatively bonded, and 7 denotes an electric field responsive functional group. The plan views of the monomolecular layers 4 of the various conductive monomolecular stacked films of FIGS. 5A to 5D are the same as that of FIG. 1B.

Fourth Embodiment

The manufacturing method for a three-terminal organic electronic device, and the structure thereof, are described using FIGS. 6A and 6B. FIGS. 6A and 6B are diagrams that schematically illustrate examples of the structure of the three-terminal organic electronic device.

First, a third electrode 17 is formed on an insulating substrate or on a substrate with insulating film on which an insulating film 18 has been formed on the surface of any substrate 11. Next, an organic thin film made of a cluster of organic molecules having a polar functional group and a polymeric group that bonds in conjugate bonds is formed in such a manner that it covers the third electrode 13 directly or via an insulating film 19. Next, the organic molecules making up the organic thin film are tilted and then bonded to one another in conjugate bonds so as to form a conduction network 15. A three-terminal organic electronic device can then be produced if a first electrode 12 and a second electrode 13 are formed in contact with the conduction network 15 and arranged at a distance from one another and from the third electrode 17.

Thus, it is possible to provide a three-terminal organic electronic device provided with the first electrode 12, the second electrode 13, which is arranged at a distance from the first electrode 12, the conductive organic thin film. 14, which electrically connects the first electrode 12 and the second electrode 13, and the third electrode 17, which is sandwiched between the substrate 11 and the organic thin film 14 and which is insulated from these, formed on a substrate, wherein the third electrode 17 is an electrode that can control the electric field that acts on the organic thin film 14 through the voltage applied between the third electrode and either the first electrode or the second electrode, and the organic thin film 14 is made of a cluster of organic molecules having a polar functional group and has the conduction network 15, which is achieved by conjugatively bonding the molecules making up the cluster of organic molecules to one another.

FIG. 6A shows a three-terminal organic electronic device of a structure in which the first electrode 12 and the second electrode 13 are in contact with the surface of the insulating film 18 on the substrate 11 and the lateral surfaces of the conductive monomolecular film 14. FIG. 6B shows a three-terminal organic electronic device of a structure in which the first electrode 12 and the second electrode 13 are formed on the surface of the conductive monomolecular film 14. When forming the first electrode 12 and the second electrode 13, if a predetermined first electrode 12 and second electrode 13 are formed by depositing a substance for electrode formation and then a mask pattern is formed using a photo-resist and etching is performed, it is possible to manufacture a three-terminal organic electronic device with either structure shown in FIG. 6A and FIG. 6B by using different mask patterns. In FIGS. 6A and 6B, the reference numeral 8 denotes polar functional groups and 15 denotes groups that are conjugatively bonded by electrolytic polymerization.

With the structure shown in FIG. 6A, organic molecules that include polymeric groups at any location can be used, and even if the molecules have a plurality of polymeric groups, a plurality of conduction networks that electrically connect the first and second electrodes can be formed. Moreover, if the monomolecular film is a monomolecular stacked film, then a conduction network can be formed in each monomolecular layer.

With the structure shown in FIG. 6B, the transmission of electricity between the conduction network 15 and the electrodes 12 and 13 is poor when the conduction network is not on the surface of the conductive monomolecular film 14 on the side opposite the substrate. Consequently, organic molecules having a polymeric group at their terminal end should be used as the material substance.

If such organic molecules are used, then a large area of contact between the conduction network of the conductive monomolecular film 14 and the electrodes can be secured, thus allowing contact point resistance to be reduced and having the advantage that good conductivity can be secured even if a monomolecular film.

If even higher conductivity is required, then it is possible to form a coating having the conduction network between the first electrode 12 and the second electrode 13. For example, after the opposing electrode step, if the product is immersed in an organic solvent in which a substance including a functional group that can be polymerized by electrolytic polymerization has been dissolved, and a first voltage is applied between the first electrode 12 and the second electrode 13 and a second voltage is applied between either the first electrode 12 or the second electrode 13 and an outside electrode that is in contact with the organic solvent and that has been arranged above the organic thin film, then a coating is formed on the surface of the monomolecular film or the monomolecular stacked film having a conduction network of the first structure, and the molecules making up the coating are polymerized through electrolytic polymerization to form a conduction network of the second structure.

Also, when forming the coating, it is possible to form a polymer film-shaped coating that similarly has a conduction network if a substance including a functional group that can be polymerized by electrolytic polymerization is applied and then a voltage is applied between the first and second electrodes.

If the organic thin film does not include a monomolecular film in which the organic molecules making up the organic thin film are arranged in monomolecular layers, then the above-mentioned differences between the structures of FIG. 6A and FIG. 6B are not present.

Figure 7A:
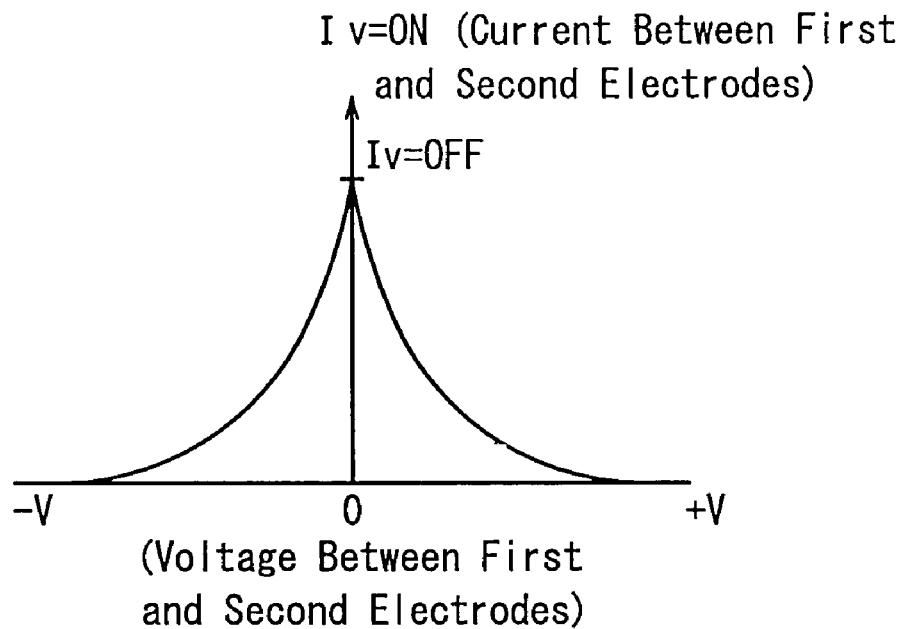
FIGS. 7A and 7B are conceptual diagrams showing how the conductivity of the three-terminal organic electronic device changes with the application of an electric field, according to the fourth embodiment of the invention, where

Next, the time fluctuation of the conductance due to the application of an electric field and the switching operation of the three-terminal organic electronic device are described with reference to FIGS. 7A and 7B. FIG. 7A is a schematic diagram that qualitatively shows the change in conductance when voltage is applied to the third electrode 17. Taking into account the fact that the voltage applied to the third electrode 17 is proportional to the electric field that acts on the organic thin film, the applied electric field and the voltage applied to the third electrode 17 both can serve as the horizontal axis, and as such the applied voltage is used in the following description. Also, the change in the conductance of the conduction network is explained as the change in current when a constant voltage is applied between the first electrode 12 and the second electrode 13.

It is clear that the conductance of the conduction network changes due to the voltage that is applied to the third electrode 17, and converges to a certain constant value as the applied voltage increases. That is, using the voltage applied to the third electrode, the conductance can be controlled within the range of the conductance when voltage is not applied to the third electrode and the conductance that has converged.

FIG. 7A shows a ease where the current during voltage application is 0 A, however, there is no limitation to a case where either one of the ON current during voltage application or the OFF current when voltage is not applied is OA. Also, in the example shown in FIG. 7A, the current value decreases due to the application of voltage, however it also may increase. These depend on the configuration of the organic thin film and the structure of the conduction network, for example.

By moving between a stable state having the first conductance, in which voltage is not applied, and a stable state having the second conductance, in which a predetermined voltage is applied, it is possible to switch the conductance of the conduction network.

Figure 7B:
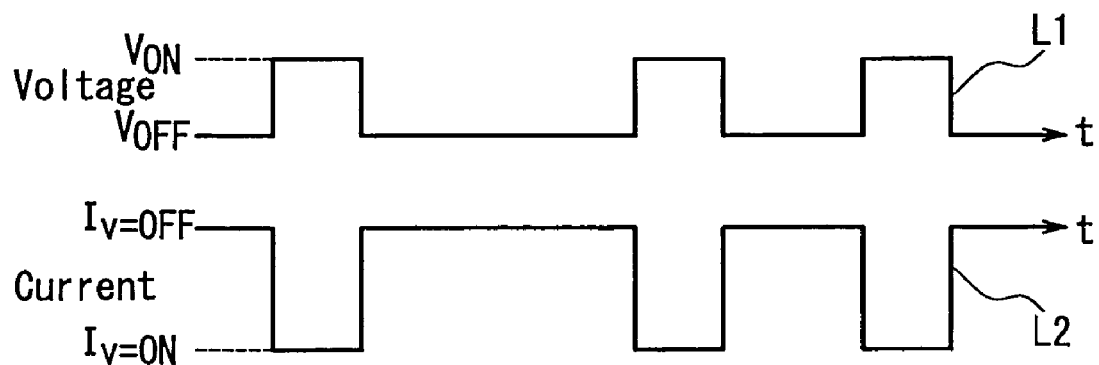

FIG. 7B is a conceptual diagram of the switching operation of the three-terminal organic electronic device, and shows how the switching operation takes place between the ON current ($I_{V=ON}$) when a predetermined voltage is applied ($V_{ON}$) and the OFF current ($I_{V=OFF}$) when voltage is not applied ($V_{OFF}$), in a state where voltage is applied between the first electrode 12 and the second electrode 13. Consequently, it is clear from FIG. 7B that the current can be switched by applying and not applying a predetermined voltage to the third electrode 17.

Although a case in which switching according to whether the voltage is ON or OFF has been shown, it is also possible to switch between the current value when the first voltage is applied to the third electrode 17 and the current value when the second voltage is applied to the third electrode 17.

The conductive organic thin film according to the present invention also can be utilized as a variable resistor for electric field control.

WORKING EXAMPLES

Hereinafter, the present invention will be described in detail through working examples. The present invention is not limited to the working examples set forth below, however. In the following working examples, figures given simply in % mean mass %.

Working Example 1

First, a substance with the chemical formula (1) shown below (PEN: 6-pyrrolylhexyl-12,12,12-trichloro-12-siladodecanoate), having a 1-pyrrolyl group ($C_4H_4N$—) with which a conduction network can be formed, an oxycarbonyl group (—OCO—), which is a polar functional group, and a trichlorosilyl group (—$SiCl_3$), which reacts with active hydrogen (for example, hydroxyl groups (—OH)) in the substrate surface in a dehydrochlorination reaction, was synthesized through the following steps 1 to 5.

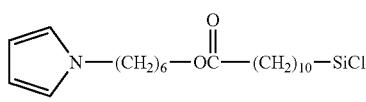

(1)

I. Method of Synthesizing Substance (PEN) of Chemical Formula (1)

Step 1: Synthesis of 6-bromo-1-(tetrahydropyranyloxy)hexane 197.8 g (1.09 mol) 6-bromo-1-hexanol were given into a 500 ml reactor vessel and cooled to 5° C. or less. 102.1 g (1.21 mol) dihydropyran were added dropwise to this at a temperature of 10° C. or less. After dropping was finished, the mixture was returned to room temperature and stirred for one hour. The precipitate obtained in the reaction was purified in a silica gel column with hexane/IPE (diusopropyl ether)=5/1, resulting in 263.4 g of 6-bromo-1-(tetrahydropyranyloxy)hexane. The yield was 90.9%. The chemical formula for the reaction formula of Step 1 is shown below in equation (2).

Step 1

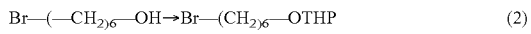

(2)

Step 2: Synthesis of N-[6-(tetrahydropyranyloxy)hexyl]pyrrole

In an argon stream, 38.0 g (0.567 mol) of pyrrole and 200 mL of dehydrated tetrahydrofuran (THF) were added into a 2L reactor vessel and cooled to 5° C. or less. To this, 354 mL (0.567 mol) of a 1.6M n-butyllithium hexane solution were added in a dropwise fashion at 10° C. or less. These were agitated for one hour at that temperature, after which 600 mL of dimethylsulfoxide were added and the THF was distilled off by heating, resulting in solvent substitution. Next, 165.2 g (0.623 mol) of the 6-bromo-1-(tetrahydropyranyloxy)hexane were added dropwise at room temperature. After dropping, these were stirred for two hours at that same temperature.

Water (600 mol) was added to the reaction mixture to extract the hexane and wash the organic layer. After drying with anhydrous magnesium sulfate, the solvent was distilled off. The precipitate was purified with a silica gel column in hexane/ethyl acetate=4/1, yielding 107.0 g of N-[6-(tetrahydropyranyloxy)hexyl]pyrrole. The yield was 75.2%. The chemical formula resulting from the reaction of Step 2 is shown in chemical formula (3) below.

Step 2

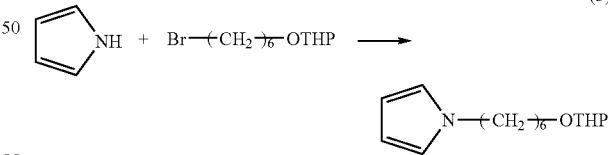

(3)

Step 3: Synthesis of N-(6-hydroxyhexsilyl)-pyrrole 105.0 g (0.418 mol) of N-[6-(tetrahydropyranyloxy) hexyl]pyrrole, which was obtained as above, 450 mL of methanol, 225 mL of water, and 37.5 mL of concentrated hydrochloric acid were added into a 1L reactor vessel and stirred for six hours at room temperature. The reaction mixture was poured into 750 mL of saturated saline solution to extract the IPE. The organic layer was washed with the saturated saline solution and dried with anhydrous magnesium sulfate to distill off the solvent. The precipitant that was obtained was purified with a silica gel column in n-hexane/ethyl acetate=3/1, yielding 63.1 g of N-(6-hydroxyhexsilyl)-pyrrole. The yield was 90.3%. The chemical formula resulting from the reaction of Step 3 is shown in chemical formula (4) below.

Step 3

(4)

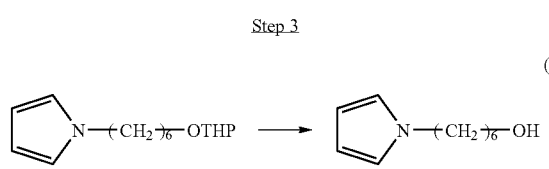

Step 4: Synthesis of N-[6-(10-undecenoyloxy)hexyl]-pyrrole 62.0 g (0.371 mol) of N-(6-hydroxyhexsilyl)-pyrrole, 33.2 g (0.420 mol) of dry pyridine, and 1850 mL of dry toluene were added into a 2L reactor vessel. 300 mL of dry toluene solution with 75.7 g (0.373 mol) of 10-undecenoyl chloride was added dropwise at 20° C. or less. The dropping time was 30 minutes. These were then stirred for one hour at that same temperature. 1.5 liters of ice water were then poured into the reaction mixture, and it was made acidic with 1N hydrochloric acid. Ether acetate was extracted, and the organic layer was washed with water and saturated saline solution and dried with anhydrous magnesium sulfate, removing the solvent and yielding 128.2 g of a crude products. This products was purified with a silica gel column in n-hexane/acetone=20/1, yielding 99.6 g of N-[6-(10-undecenoyloxy)hexyl]-pyrrole. The yield was 80.1%. The chemical formula resulting from the reaction of Step 4 is shown below in chemical formula (5).

Step 4

(5)

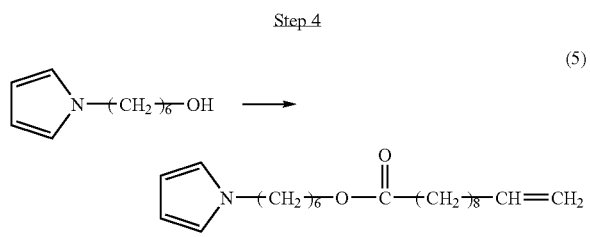

Step 5: Synthesis of PEN 2.0 g (6.0×10$^{-3}$ mol) of the N-[6-(10-undecenoyloxy)hexyl]-pyrrole, 0.98 g (7.23×10$^{-3}$ mol) of trichlorosilane, and 0.01 g of isopropyl alcohol solution including H$_2$PtCl$_6$.6H$_2$O at 5 wt % were added into a 100 mL capped pressure-resistant test tube and were reacted at 100° C. for 12 hours. The solution yielded by this reaction was processed with active carbon and then low-boiling point components were distilled out under a low pressure of 2.66×10$^3$ Pa (20 Torr), yielding 2.3 g of PEN. The yield was 81.7%. The chemical formula resulting from the reaction of Step 5 is shown in chemical formula (6) below.

Step 5

(6)

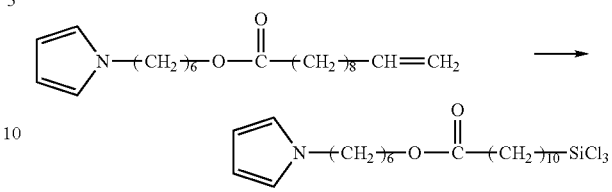

It should be noted that to substitute the terminal trichlorosilyl group with a trimethoxysilyl group, the PEN of the above chemical formula (1) is mixed with methyl alcohol at three times its mol content at room temperature (25° C.), causing a dehydrochlorination reaction. As necessary, sodium hydroxide is added to separate away the hydrogen chloride in the form of sodium chloride.

Figure 15:
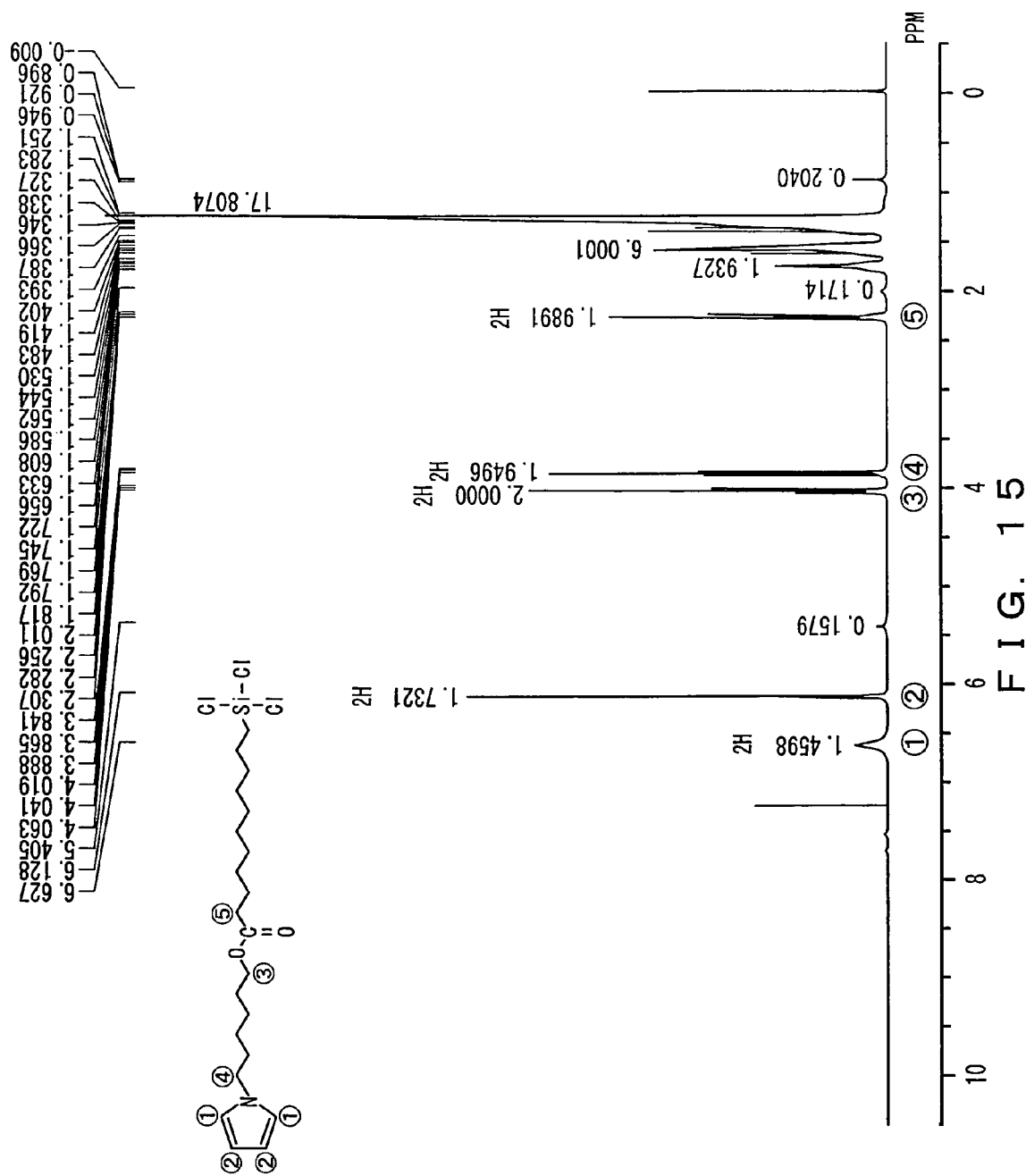
FIG. 15 is an NMR chart of the pyrrolyl compound obtained in Working Example 1 of the invention.
Figure 16:
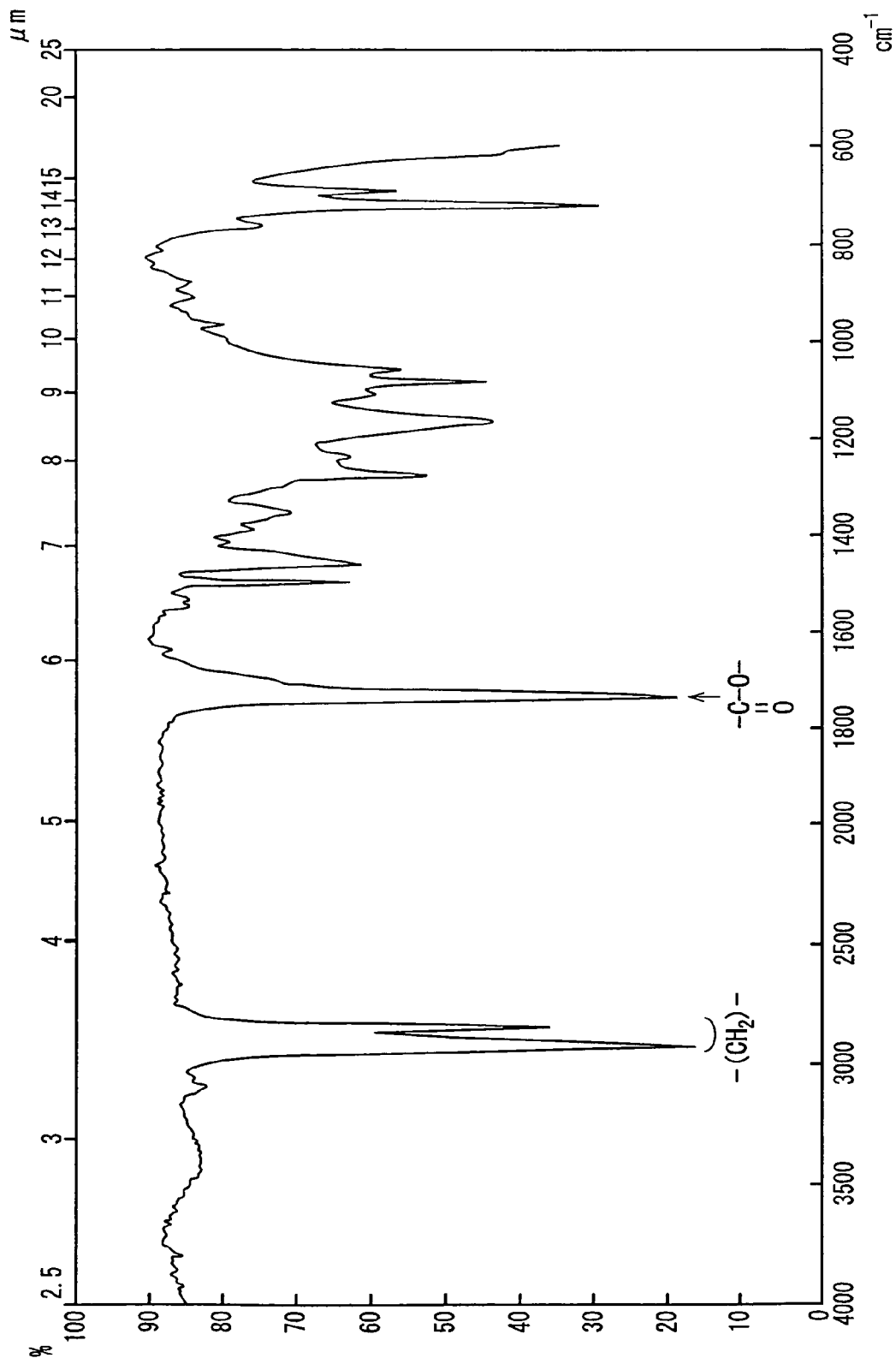
FIG. 16 is an IR chart of the pyrrolyl compound obtained in Working Example 1 of the invention.

FIG. 15 shows an NMR chart and FIG. 16 shown an IR chart of the PEN that is obtained. (NMR)
(1) Measuring Instrument: AL300 (instrument name) (made by JEOL Ltd.)
(2) Measurement Conditions: $^1$H-NMR (300 MHz), 30 mg sample dissolved in CDCl$_3$ and measured.

(Infrared Radiation Absorption Spectrum: IR)
(1) Measuring Instrument: 270-30 model (instrument name) (made by Hitachi, Ltd.)
(2) Measurement Conditions: neat (sample sandwiched between two NaCl plates and measured)

II. Method for Forming the Molecule Film

The PEN with the above chemical formula (1) is diluted to 1 wt % with a dehydrated dimethyl silicone solvent, producing a chemisorption solution.

Figure 8:
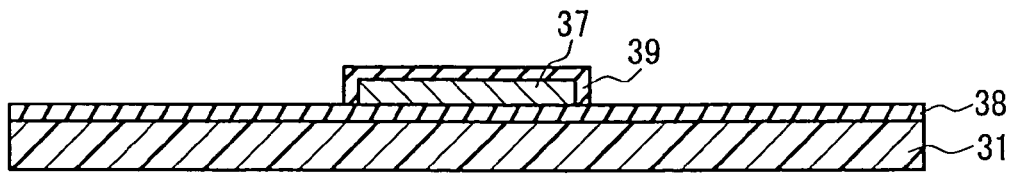
FIG. 8 is a conceptual enlarged cross-sectional diagram of the substrate on which the third electrode is formed, and is for describing the third electrode formation step according to Working Example 1 of the invention.
Figure 9:
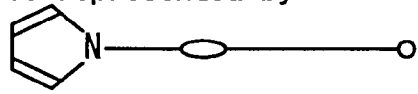
FIG. 9 is a conceptual cross-sectional diagram showing a substrate on which a monomolecular film is formed, magnified to the molecular level, and is for illustrating the film formation step according to Working Example 1 of the invention.
Figure 9:
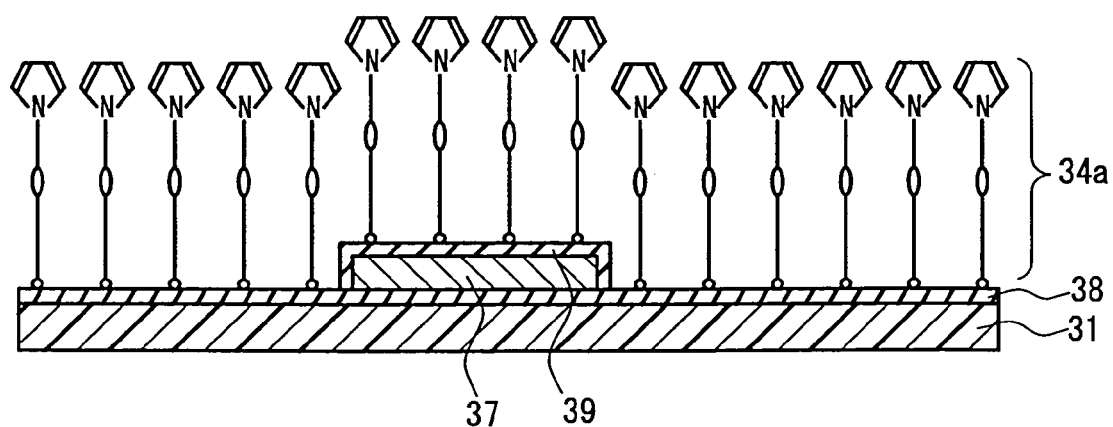

Next, aluminum (Al) was vapor deposited on the surface of an insulating polyimide substrate 31 (it is also possible to form a first insulating film, such as a silica film 38, on the surface of a conductive metal substrate, and a glass substrate also may be used) and etched using photolithograpby, forming a third electrode 27 with a length of 15 μm and a width of 40 μm. The third electrode 37 made of Al was then subjected to electrolytic oxidation to form an insulating alumina (Al$_2$O$_3$) film 39 on its surface (FIG. 8). The polyimide substrate 31 was then covered with a resist, leaving portions at which to form the monomolecular film, and immersed in the chemisorption solution at room temperature (25° C.) for one hour, causing a dechlorination reaction at the substrate surface and selectively forming a thin film at the openings in the resist. Non-reacted substance remaining on the substrate was removed by washing with anhydrous chloroform, after which the mask pattern of the photoresist was removed, thereby selectively forming a monomolecular film 34a constituted by the substance (FIG. 9).

At this time there were numerous hydroxide groups including active hydrogen on the surface of the polyimide substrate 31 at the openings (the surface of the silicon film 38 and the Al$_2$O$_3$ film 39), and thus the chlorosilyl group (—SiCl) of the substance reacts with the hydroxide groups in a dehydrochlorination reaction, forming a monomolecular film 34 constituted by the molecules shown in the chemical formula (7) that are covalently bonded to the surface of the polyimide substrate 31.

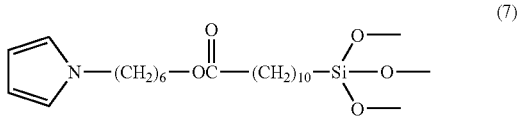

(7)

III. Method for Giving Orientation to the Molecular Film

Figure 10:
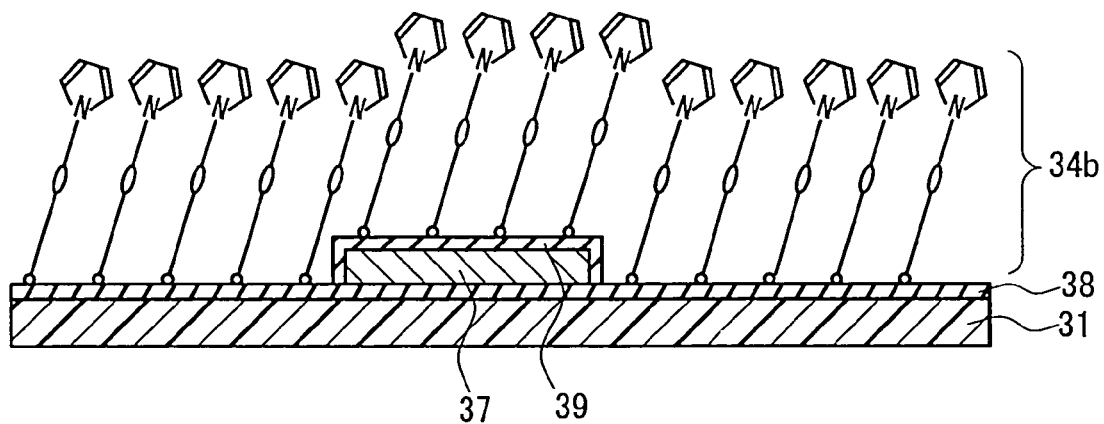
FIG. 10 is a conceptual cross-sectional diagram showing a substrate on which an oriented monomolecular film has been formed, magnified to the molecular level, according to Working Example 1 of the invention.

The polyimide substrate 31 on which the monomolecular film 34a is formed was then immersed in a chloroform solution and washed, and when the polyimide substrate 31 was lifted from the chloroform solution it was lifted up vertically in an upright position so that the solution was allowed to run off parallel to the direction from the first electrode to the second electrode, forming a monomolecular film 34b oriented one-dimensionally from the first electrode to the second electrode (FIG. 10).

IV. Method for Forming the Electrodes

Then, after a nickel thin film was formed over the entire surface by vapor deposition, it was etched using photolithography to form the first electrode 22 and the second electrode 23, which are distanced from one another by 10 µm and are 30 µm long, in such a manner that they sandwich the third electrode 37.

V. Electrolytic Polymerization

Figure 11:
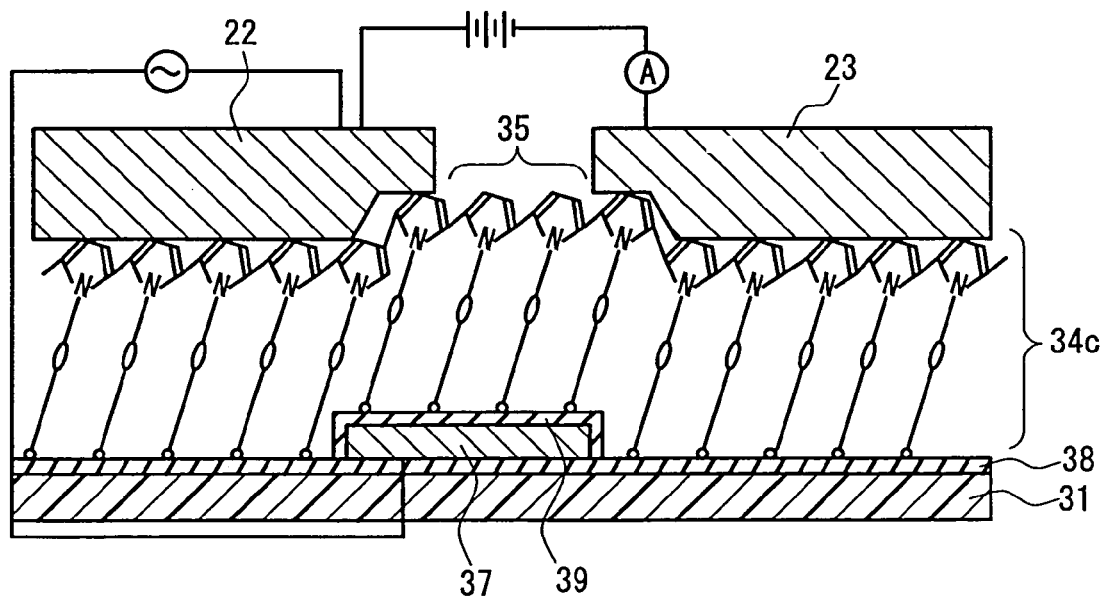
FIG. 11 is a conceptual cross-sectional diagram of a magnification up to the molecular level of the substrate on which a conduction network and first and second electrodes are formed, and is for describing the opposing electrode formation step and the conduction network formation step according to Working Example 1 of the invention.

Then, an electric field of 5 V/cm was applied between the electrodes in a pure water solution, resulting in polymerization through electrolytic oxidation. Polymerization through electrolytic oxidation was performed at a reaction temperature of 25° C. and a reaction time of five hours. Consequently, the first electrode 22 and the second electrode 23 were electrically connected by the conduction network 35 obtained through the electrolytic polymerization. At this time, conjugate bonds were formed through self-assembly in the direction of the electric field, so that when polymerization was completely finished the first electrode 22 and the second electrode 23 were electrically connected to one another through the conduction network 35. Lastly, the third electrode 37 was drawn out from the substrate 31 side, producing the three-terminal organic electronic device (FIG. 11). The thickness of the organic conductive film 34C that was obtained was approximately 2.0 nm, the thickness of the polypyrrole portion was approximately 0.2 nm, and the length of the organic conductive film 34C was 10 mm and its width was 100 µm.

A monomer of the organic conductive film polymer that was obtained is shown below in chemical formula (8).

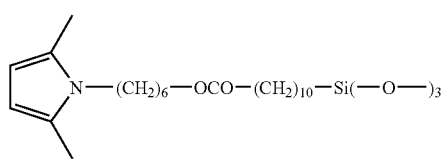

(8)

VI. Measurement

With this three-terminal organic electronic device, the first electrode 22 and the second electrode 23 are connected by the polypyrrole conduction network 35. The organic conductive film 34C that was obtained was examined with a commercial atomic force microscope (AFM) (SAP 3800N made by Seiko Instruments, Inc.), and in the AFM-CITS mode, the conductivity ρ at a voltage of 1 mV and a current of 160 nA was found to be greater than $1 \times 10^7$ S/cm at room temperature (25° C.) without doping. This was determined due to the fact that the ampere meter could measure only up to $1 \times 10^7$ S/cm, and the needle of the meter had swung beyond that point. Considering that at room temperature (25° C.), gold, which is a good conductor, has a conductivity of $5.2 \times 10^5$ S/cm and silver has a conductivity of $5.4 \times 10^5$ S/cm, the conductivity ρ of the organic conductive film of this working example is remarkably high. In light of this value, the organic conductive film of the present invention can be regarded as a "metal-surpassing conductive film."

In the present invention, the conductivity ρ of the organic conductive film can be lowered easily by making the conduction network incomplete or making the molecules less oriented.

Next, with respect to the organic conductive film obtained as mentioned above, when a voltage of 1V is applied between the first electrode 22 and the second electrode 23 and the voltage between the first electrode 22 and the third electrode 37 is set to 0V, a current of about 1 mA is allowed to flow.

Then, when a voltage of 5V is applied between the first electrode 22 and the third electrode 37 with the voltage of 1V still being applied between the first electrode 22 and the second electrode 23, the value of the current between the first electrode 22 and the second electrode 23 becomes substantially 0 A (zero amperes). The original conductance subsequently reappeared when the voltage between the first electrode 22 and the third electrode 37 was returned to 0V from 5V.

This drop in conductivity is likely due to strain in the polypyrrole conjugate system that lowers the conductance of the conduction network 35, caused by an increase in polarity of the oxycarbonyl group (—OCO—), which is a polar functional group, when the voltage of 5V is applied between the third electrode 37 and the first electrode 22.

That is, using the voltage applied between the first electrode 22 and the third electrode 37, it was possible to control the conductance of the conduction network so as to switch the current flowing between the first electrode 22 and the second electrode 23.

Working Example 2

{6-[(3-thienyl)hexyl-12,12,12-trichloro-12-siladodecanoate]} (TEN), shown below in chemical formula (9), was synthesized through the steps detailed below.

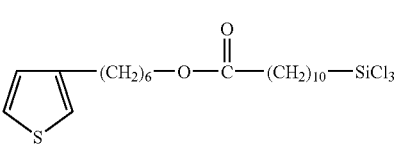

(9)

(1) Step 1: Synthesis of 6-bromo-1-(tetrahydrolyranyloxy)hexane

The reaction shown below in chemical formula (10) was performed to synthesize 6-bromo-1-(tetrahydropyranyloxy) hexane. First, 197.8 g (1.09 mol) of 6-bromo-1-hexanol were given into a 500 ml reactor vessel and cooled to 5° C. or less, after which 102.1 g (1.21 mol) of dihydropyran were added dropwise at 10° C. or less. After dropping was finished, the mixture was returned to room temperature and stirred for one hour.

Step 1

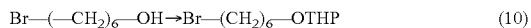
(10)

The precipitate that was obtained was supplied into a silica gel column and purified using a mixed solvent of hexane:diisopropyl ether (IPE) (volume ratio of 5:1) as the dissolution medium, yielding 263.4 g of 6-bromo-1-(tetrahydropyranyloxy)hexane. The yield at this time was 90.9%.

(2) Step 2: Synthesis of 3-[6-(tetrahydropyranyloxy)hexyl]thiophene

The reaction shown below in chemical formula (11) was performed to synthesize 3-[6-(tetrahydropyranyloxy)hexyl]thiophene.

Step 2

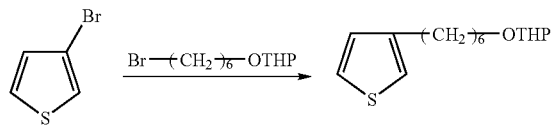
(11)

First, in an argon stream, 25.6 g (1.06 mol) of magnesium turnings were added into a 2 L reactor vessel and added dropwise at room temperature to four liters of dry tetrahydrofuran (dry THF) solution including 140.2 g (0.529 mol) of 6-bromo-1-(tetrahydropyranyl)hexane. The dropping time was one hour 50 minutes, and the reaction was exothermic. Stirring was then performed for 1.5 hours at room temperature to prepare a Grignard reagent Next, 88.2 g (541 mol) of 3-bromothiophene and 3.27 g of dichlorobis(triphenylphosphine)nickel(II) were added into a new 2 L reactor vessel under an argon stream, and the entire quantity of the Grignard reagent prepared above was added dropwise at room temperature. At this time, the temperature within the reactor vessel was kept at room temperature (50° C. or less), and the dropping time was 30 minutes. After dropping, the mixture was stirred for 23 hours at room temperature.

The mixture obtained through the reaction was added to 1.3 L of 0.5N HCl maintained at 0° C. so as to extract the IPE. The organic layer that was obtained was washed with water and then washed with saturated saline solution, after which it was dried by adding anhydrous magnesium sulfate. The solvent was then distilled off, yielding 199.5 g of a crude product including 3-[6-(tetrahydropyranyloxy)hexyl]-thiophene. This crude product was used in the next step without purification.

(3) Step 3: Synthesis of 3-(6-hydroxyhexyl)-thiophene

The reaction shown below in chemical formula (12) was performed to synthesize 3-(6-hydroxyhexyl)-thiophene.

Step 3

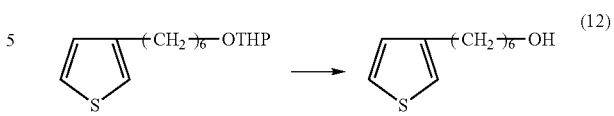
(12)

The non-purified 3-[6-(tetrahydropyranyloxy)hexyl]-thiophene obtained in Step 2 (199.5 g), 450 mL of methanol, 225 mL of water, and 37.5 mL of concentrated hydrochloric acid were added into a 1 L reactor vessel and reacted by stirring for six hours at room temperature. The mixture obtained through this reaction was added to saturated saline solution (750 mL) to extract the IPE. The organic layer that was obtained was then washed with saturated saline solution and dried with anhydrous magnesium sulfate, after which the solvent was distilled off to yield 148.8 g of a crude product including 3-(6-hydroxyhexyl)-thiophene. This crude product was supplied into a silica gel column and purified using a mixed solvent of n-hexane:ethyl acetate (volume ratio 3:1) as the dissolution medium, yielding 84.8 g of 3-(6-hydroxyhexyl)-thiophene. The yield at this time was 87.0% with respect to the crude product including 3-[6-(tetrahydropyranyloxy)hexyl]-thiophene obtained in Step 2.

(4) Synthesis of 3-[6-(10-undecenoyloxy)hexyl]-thiophene

The reaction shown below in chemical formula (13) was performed to synthesize 3-(6-(10-undecenoyloxy)hexyl)-thiophene.

Step 4

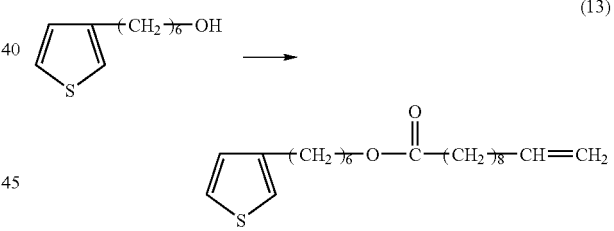
(13)

84.4 g (0.458 mol) of the crude product obtained in Step 3, which includes 3-(6-hydroxyhexyl)-thiophene, 34.9 g (0.442 mol) of dry pyridine, and 1450 mL of dry toluene were added into a 2 L reactor vessel, and at 20° C. or less, 250 mL of a dry toluene solution including 79.1 g (0.390 mol) of 10-undecenoyl chloride was added dropwise. The dropping time was 30 minutes, after which stirring was performed for 23 hours at that same temperature. The mixture obtained through this reaction was added to 2L of ice water, and then 75 mL of 1 N hydrochloric acid were added. Ether acetate was extracted from this mixed solution, and the organic layer that was obtained was washed with water and then washed with saturated saline solution, after which it was dried by adding anhydrous magnesium sulfate. The solvent was then removed, yielding 161.3 g of a crude product body having 3-[6-(10-undecenoyloxy)hexyl]-thiophene. This crude product was used in a silica gel column and purified using an n-hexane:acetone mixture solvent (volume ratio 20:1) as the dissolution medium, yielding 157.6 g of 3-[6-(10-undecenoyloxy)hexyl]-thiophene. The yield at this time was 98.2% with respect to the crude product including 3-(6-hydroxyhexyl)-thiophene obtained in Step 3.

(5) Step 5: Synthesis of TEN

The reaction shown below in chemical formula (14) was performed to synthesize TEN.

Step 5

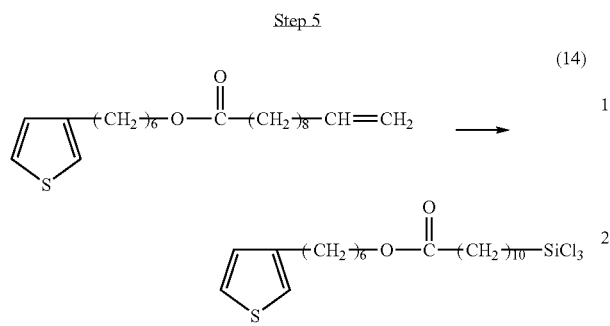

(14)

(a) First, 10.0 g ($2.86 \times 10^{12}$ mol) of 3-[6-(10-undecenoyloxy)hexyl]-thiophene, 4.65 g ($3.43 \times 10^4$ mol) of trichlorosilane, and 0.05 g of an isopropyl alcohol solution containing $H_2PtCl_6.6H_2O$ at 5 wt % were added into a 100 mL pressure-resistant test tube with a cap and reacted at 100° C. for 14 hours. The solution yielded by this reaction was processed with active carbon and then low-boiling point components were distilled out under low pressure. The low pressure conditions were set to $2.66 \times 10^3$ Pa (20 Torr).

(b) Similarly, 39.0 g. ($1.11 \times 10^{-1}$ mol) of 3-[6-(10-undecenoyloxy)hexyl]-thiophene, 18.2 g ($1.34 \times 10^{-1}$ mol) of trichlorosilane, and 0.20 g of an isopropyl alcohol solution containing $H_2PtCl_6.6H_2O$ at 5 wt % were added into a 100 mL pressure-resistant test tube with cap and reacted at 100° C. for 12 hours. The solution yielded by this reaction was processed with active carbon and then low-boiling point components were distilled out under low pressure. The low pressure conditions were the same as above.

The precipitates obtained in (a) and (b) were mixed and passed through argon gas for one hour to remove hydrochloric gas, thereby yielding 65.9 g of TEN, the target product. The yield of TEN at this time was 97.2% with respect to the coarse body including 3-[6-(10-undecenoyloxy)hexyl]-thiophene that was obtained in Step 4.

Figure 17:
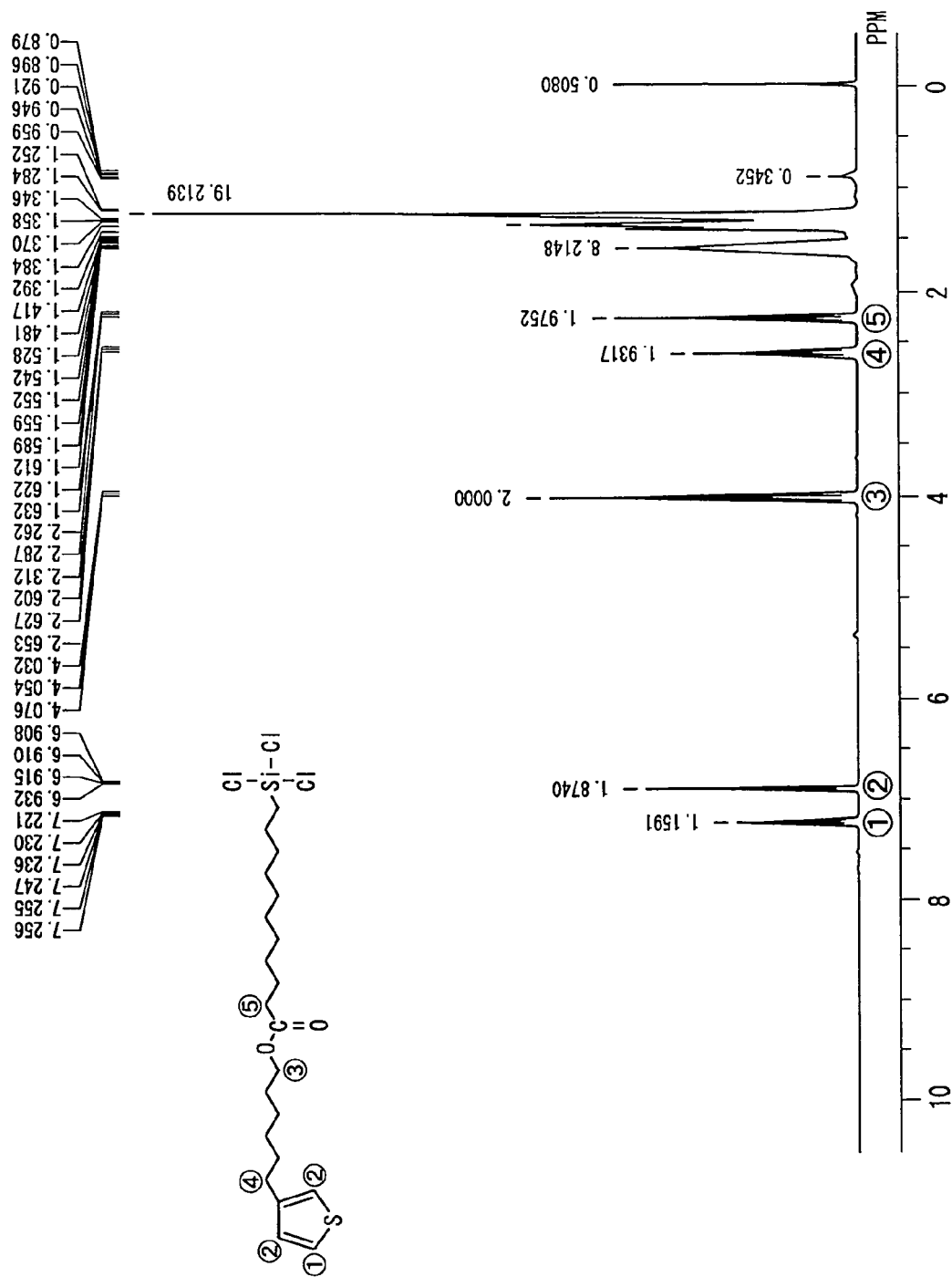
FIG. 17 is an NMR chart of the thienyl compound obtained in Working Example 2 of the invention.

The TEN that was obtained was analyzed through IR analysis and NMR analysis. The conditions and the results of these analyses are shown below. It should be noted that the NMR chart is shown in FIG. 17 and the IR chart is shown in FIG. 18.

(NMR)
(1) Measuring Instrument: AL300 (instrument name) (made by JEOL Ltd.)
(2) Measurement Conditions: $^1$H-NMR (300 MHz), 30 mg sample dissolved in $CDCl_3$ and measured.

(Infrared Radiation Absorption Spectrum: IR)
(1) Measuring Instrument: 270-30 model (instrument name) (made by Hitachi, Ltd.)
(2) Measurement Conditions: neat (sample sandwiched between two NaCl plates and measured)

The TEN that was obtained was used to form a conductive molecule film made of polythienylene through electrolytic polymerization in the same manner as in Working Example 1. The film thickness of the organic conductive film that was obtained was approximately 2.0 nm, the thickness of the polythienylene portion was approximately 0.2 nm, and the length of the organic conductive film was 10 mm and its width was 100 μm. Also, the organic conductive film that was obtained was transparent under radiation in the visible spectrum.

A monomer unit of the organic conductive film polymer that was obtained is shown below in chemical formula (15).

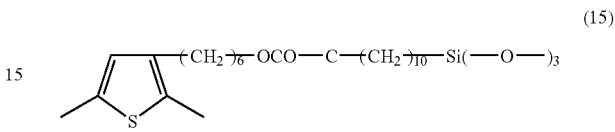

(15)

In the same manner as in Working Example 1, this organic conductive film was examined with a commercial atomic force microscope (AFM) (SAP 3800N made by Seiko Instruments, Inc.), and in AFM-CITS mode, the conductivity was measured under the conditions of a 1 mV voltage and a 160 nA current. The conductivity ρ was found to be greater than $1 \times 10^7$ S/cm at room temperature (25° C.) without doping Working Example 3

In this working example, a monomolecular thin film 24b that is highly oriented is obtained when, after orientation is provided by allowing liquid to run off, visible light polarized in the direction from the first electrode 22 to the second electrode 23 is irradiated at about 500 mJ/cm². At this time, when similar radiation is irradiated and intersects the polarized light at an angle of 45° with respect to the direction from the first electrode 22 to the second electrode 23, the organic molecules making up the monomolecular film are moved from the original direction in which they were lifted up and are oriented in a direction that is substantially parallel to the polarization direction.

Thus, it was possible to form a conductive monomolecular film 24c with superior conductivity by performing the step for forming the conduction network after performing orientation by letting the liquid run off and providing orientation by irradiating polarized light.

Here, etching can be carried out at extremely high speeds when the polar functional group is a polar oxycarbonyl group. In place of the oxycarbonyl group it is also possible to use molecules that have a carbonyl or an ester functional group, for example.

Also, as the conduction network 35 it was possible to use a polyacetylene-based, a polydiacetylene-based, a polyacene-based, a polypyrrole-based, or a polythienylene-based conjugate system, and the conductance was high. Also, as the polymeric group that is bonded in conjugate bonds to form the conduction network, it is possible to use a thienylene group in the same manner as a pyrrole group as the functional group that can be polymerized by electrolytic polymerization. It should be noted that if the method of polymerization is changed, then it is also possible to use a substance that has an acetylene group or a diacetylene group.

A Langmuir-Blodgett technique can be used in place of chemisorption in order to fabricate the monomolecular film or the monomolecular stacked film.

Also, when the first electrode 22 and the second electrode 23 are formed before the organic thin film is polymerized, it is possible to utilize the first electrode 22 and the second electrode 23 in the electrolytic polymerization when forming the conduction network. That is, an organic thin film made of a cluster of organic molecules having a pyrrole group or a thienylene group as a functional group that can be polymerized through electrolytic polymerization can be polymerized selectively through electrolytic polymerization between the first electrode 22 and the second electrode 23 of the organic thin film by applying voltage between the first electrode 22 and the second electrode 23.

It is possible to form the third electrode 37, the oriented monomolecular film 34b made of a cluster of organic molecules having a pyrrole group or a thienylene group, the first electrode, and the second electrode on the substrate, then immerse the substrate in an organic solvent in which a substance including a pyrrole group or a thienylene group has been dissolved, and then apply a first voltage between the first electrode 22 and the second electrode 23, and bring the first electrode 22 or the second electrode 23 into contact with the organic solvent and apply a second voltage between that electrode and an outside electrode arranged above the monomolecular film 34b that has been oriented to form a coating on the surface of the oriented monomolecular film 34b and at the same time also form a polypyrrole-based or a polythienylene-based conduction network in the monomolecular film and the cover layer. In this case, the organic electronic device has a channel portion made of the polymer film-shaped coating layer and the monomolecular film layers, each having a conduction network.

It is also possible to form the third electrode 37, the oriented monomolecular film 34b made of a cluster of organic molecules having a pyrrole group or a thienylene group, the first electrode 22, and the second electrode 23 on the substrate and form a polypyrrole-based or a polythienylene-based conduction network of a first structure in the monomolecular film 34b that has been oriented, then immerse the substrate in an organic solvent in which a substance including a pyrrole group or a thienylene group has been dissolved, apply a first voltage between the first electrode 22 and the second electrode 23, and bring the first electrode 22 or the second electrode 23 into contact with the organic solvent and apply a second voltage between that electrode and an outside electrode arranged above the conductive monomolecular film 34c to form a coating on the surface of the monomolecular film 34c, in which the conduction network has been formed, and at the same time also form a polypyrrole-based or a polythienylene-based conduction network of a second structure in the coating. In this case, the organic electronic device has a channel portion made of the monomolecular film layer and a polymer film-shaped coating layer, each having a conduction network.

In addition to electrolytic polymerization, the conduction network also can be formed through catalytic polymerization in which the molecules of a monomolecular film or a monomolecular stacked film, which are made of a cluster of organic molecules having polymeric groups such as a pyrrole group, an acetylene group, and a diacetylene group, which are functional groups that can be polymerized through catalytic polymerization, are catalytically polymerized to one another. It is also possible to form the conduction network by irradiating an energy beam such as ultraviolet radiation, far ultraviolet radiation, an electron beam, or X-ray radiation onto a monomolecular film or a monomolecular stacked film, which are made of a cluster of organic molecules having polymeric groups such as an acetylene group or a diacetylene group, which are functional groups that can be polymerized through irradiation of a beam, so as to polymerize the organic molecules.

Working Example 4

Using the same method as in Working Example 1, a plurality of three-terminal organic electronic devices were fabricated as liquid crystal operation switches and arranged in an array on the surface of an acrylic substrate to fabricate an array substrate, and then an oriented film was formed on the surface of the array substrate. A screen printing method was used to form sealing adhesive in a pattern except at sealing aperture portions, after which precuring was performed and the substrate was aligned in opposition to the orientated film of a color filter substrate, the two were attached and pressure adhered to one another, and the adhesive formed in a pattern was cured, fabricating an empty cell. Lastly, a predetermined liquid crystal was vacuum injected into the empty cell and the liquid crystal was sealed off, producing a liquid crystal display device. Here, except for fabricating a TFT array substrate by forming the three-terminal organic electronic devices on a substrate, technologies in the public domain were used.

With this method it is not necessary to heat the substrate when manufacturing the TFT array, and thus a TFT liquid crystal display device with sufficiently high picture quality can be produced even if a substrate with a low glass transition point (Tg), such as an acrylic substrate, is used.

Working Example 5

Using the same method as in Working Example 1, a plurality of three-terminal organic electronic devices were arranged in an array on the surface of an acrylic substrate as liquid crystal operation switches in order to fabricate a TFT array substrate. Then, using a publicly-known method, pixel electrodes were formed connected to the three-terminal organic electronic devices and an electric field was applied to the TFT array substrate, forming a light-emission layer made of fluorescent substances that emit light, and a transparent common electrode was formed on the light-emitting layer in opposition to the TFT array substrate, producing an electroluminescence-type color display device. Here, except for forming an array substrate by forming the three-terminal organic electronic devices on a substrate, technologies in the public domain were used.

It was possible to manufacture the electroluminescence-type color display device by forming three types of elements for emitting red, blue, and green light at predetermined locations when the light-emitting layer was formed. Publicly-known technologies were used to arrange the color elements in an array.

Working Example 6

In this working example, the PEN (chemical formula (1)) described in Working Example 1 is used to form a monomolecular film (chemical formula (7)) on the surface of a glass fiber with a diameter of 1 mm serving as a substrate, and the molecules were oriented when the substrate was lifted up from the solvent. Then, electrodes were arranged at both ends of the glass fiber, and in a pure water solution, an electric field of 5V/cm was applied between the electrodes to carry out polymerization through electrolytic oxidation. The conditions of the electrolytic polymerization were a reaction temperature of 25° C. and a reaction time of eight hours, and a polypyrrole film polymerized in conjugate bonds (chemical formula (8)) was formed at a length of 10 mm on the glass fiber in the axial direction of the glass fiber. The film thickness of the organic conductive film 34C that was obtained was approximately 2.0 nm and the thickness of the polypyrrole portion was approximately 0.2 nm. Also, the organic conductive film that was obtained was transparent with regard to radiation in the visible spectrum.

Figure 13:
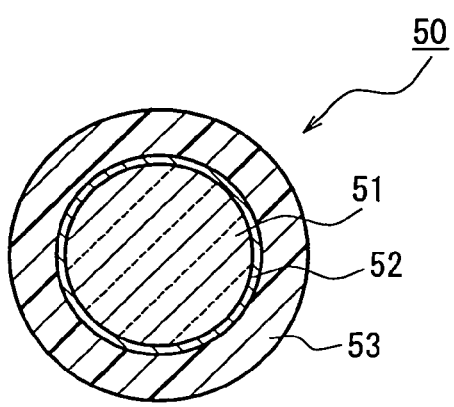
FIG. 13 is a conceptual cross-sectional diagram of the electric cable obtained in Working Example 6 of the invention.

An electric cable was fabricated by forming an insulating film covering the surface of the organic thin film obtained in this manner. A cross section of the electric wire that was obtained is shown in FIG. 13. In FIG. 13, reference numeral 50 denotes an electric cable, 51 denotes a glass core wire, 52 denotes a polypyrrole film obtained through polymerization through electrolytic oxidation, and 53 denotes a cover insulating film made of silicon rubber that is cured at room temperature.

It was confirmed that the conductivity o of the electric cable was greater than $1 \times 10^7$ S/cm without doping, making the film a "metal-surpassing conductive film." The conductivity was measured using the same method as in Working Example 1.

In this working example, the electric cable can be constituted by a plurality of core wires that are electrically insulated from one another, forming an electric wiring assembly.

Metal as well as glass can be used for the core wires making up the electric wiring. In the case of metal, the monomolecular film can be formed easily when oxides are formed on the surface.

Working Example 7

In Working Examples 1 to 5, whether the conductive molecules are oriented can be confirmed by forming a liquid crystal cell 60 such as that shown in FIG. 14, sandwiching the liquid crystal cell 60 between polarizing plates 67 and 68, and irradiating light from the rear surface and observing the cell from a position 70. The liquid crystal cell 60 is formed by arranging glass plates 61 and 63, on which conductive molecule films 62 and 64 have been formed, respectively, with their conductive molecule films facing inward, keeping them at a distance of 5 to 6 µm from one another and sealing their margin using an adhesive 65, and then injecting a liquid crystal composition 66 (a nematic liquid crystal, such as "LC, MT-5087LA" made by Chisso Corporation) into the interior of the cell.

(1) If the polarizing plates 67 and 68 are arranged crosswise, then the orientation directions of the conductive molecule films 62 and 64 are aligned and one polarizing plate is made parallel to this direction and the other polarizing plate is made perpendicular to this direction. If the orientation is perfect, then the liquid crystal becomes oriented and black is seen uniformly. If black is not seen uniformly, then the orientation is imperfect.

(2) If the polarizing plates 67 and 68 are arranged parallel, then the orientation directions of the conductive molecule films 62 and 64 are aligned and both polarizing plates are made parallel to this direction. If the orientation is perfect, then the liquid crystal becomes oriented and white is seen uniformly. If white is not seen uniformly, then the orientation is imperfect.

It should be noted that if the substrate on the rear side is not transparent, then there is a single polarizing plate on the top side and observation is made using the light that is reflected when light is irradiated from the surface.

With this method, it was possible to confirm that the conductive molecule films obtained in Working Examples 1 to 5 were oriented.

INDUSTRIAL APPLICABILITY

As described above, with the present invention it is possible to provide a conductive organic thin film, and a method for manufacturing the same, that has either higher conductivity than conventional organic conductive films or has conductivity that is on par with-or exceeds that of conductive metals such as gold or silver.

The present invention can also provide a device that is highly integrated, by fabricating the device using an organic substance that is not affected by crystallinity, even if the device is made very dense and is minutely processed to a size less than 0.1 µm. Also, by forming the device on a flexible substrate, for example, the present invention also can provide an organic electronic device with excellent flexibility.

The invention claimed is:

1. A three-terminal organic electronic device, comprising a first electrode formed on a substrate, a second electrode that is arranged at a distance from the first electrode, a conductive organic thin film that electrically connects the first electrode and the second electrode, and a third electrode that is sandwiched between the substrate and the conductive organic thin film, and that is insulated from said first and second electrodes; wherein the third electrode is an electrode that controls an electric field that acts on the conductive organic thin film by the voltage applied between itself and the first electrode or the second electrode; and wherein the conductive organic thin film is made of oriented organic molecules that include, at one end, a terminal bonding group that is covalently bonded to the substrate surface, wherein the terminal bonding group is at least on selected from a siloxane (—SiO—)-containing bonding group and a silicon nitride (—SiN—)-containing bonding group, and wherein the Si atomic nucleus and the N atomic nucleus can be additionally furnished with other bonded groups with corresponding valence; a conjugate bonding group that is located at any portion of the oriented organic molecules away from the terminal bonding group covalently bonded to the substrate surface, and that is polymerized with the conjugate bonding groups of the other oriented organic molecules; and a polar functional group that does not include active hydrogen and that is located at any portion between the terminal bonding group and the conjugate bonding group on the oriented organic molecules, wherein the polar functional group that does not include active hydrogen is at least one group selected from an ester group (—COO—), an oxycarbonyl group (—OCO—), a carbonyl group (—CO—), and a carbonate group (—OCOO—), and bonded to both sides of the polar functional group are alkylene groups which are —(CH2)m- and —(CH2)n-, where m and n are integers; and the oriented organic molecules with their conjugate bonding groups are polymerized, forming a conduction network.

2. A liquid crystal display device that uses, as a switching element, a three-terminal organic electronic device comprising a first electrode formed on a substrate, a second electrode that is arranged at a distance from the first electrode, and a third electrode that electrically connects the first electrode and the second electrode via a conductive organic thin film of organic molecules which include, at one end, a terminal bonding group that is covalently bonded to the substrate surface, wherein the terminal bonding group is at least one selected from a siloxane (—SiO—)-containing bonding group and a silicon nitride (—SiN—)-containing bonding group, and wherein the Si atomic nucleus and the N atomic nucleus can be additionally furnished with other bonded groups with corresponding valence; a conjugate bonding group that is located at any portion of the oriented organic molecules away from the terminal bonding group covalently bonded to the substrate surface, and that is polymerized with the conjugate bonding groups of the other oriented organic molecules; and a polar functional group that does not include active hydrogen and that is located at any portion between the terminal bonding group and the conjugate bonding group on the oriented organic molecules, wherein the polar functional group that does not include active hydrogen is at least one group selected from an ester group (—COO—), an oxycarbonyl group (—OCO—), a carbonyl group (—CO—), and a carbonate group (—OCOO—), and bonded to both sides of the polar functional group are alkylene groups which are —(CH2)m- and —(CH2)n-, where m and n are integers; and the oriented organic molecules with their conjugate bonding groups are polymerized, forming a conduction network; wherein the third electrode is sandwiched between the substrate and the conductive organic thin film, is insulated from said first and second electrodes, and controls an electric field that acts on the conductive organic thin film through the voltage applied between itself and the first electrode or the second electrode, the liquid display device comprising: an array substrate on which a plurality of the switching elements are arranged in a matrix on the substrate; a first oriented film formed on the surface of the array substrate; a color filter substrate in which color elements are arranged in a matrix on a transparent substrate; a second oriented film formed on a surface of the color filter substrate; and a liquid crystal layer sealed between the array substrate and the color filter substrate, which are in opposition to one another with the first oriented film and the second oriented film facing inward.

3. An electroluminescence-type display device that uses, as a switching element, a three-terminal organic electronic device comprising a first electrode formed on a substrate, a second electrode that is arranged at a distance from the first electrode, and a third electrode that electrically connects the first electrode and the second electrode through a conductive organic thin film is made of organic molecules that include, at one end, a terminal bonding group that is covalently bonded to the substrate surface, wherein the terminal bonding group is at least one selected from a siloxane (—SiO—)-containing bonding group and a silicon nitride (—SiN—)-containing bonding group, and wherein the Si atomic nucleus and the N atomic nucleus can be additionally furnished with other bonded groups with corresponding valence; a conjugate bonding group that is located at any portion of the oriented organic molecules away from the terminal bonding group covalently bonded to the substrate surface, and that is polymerized with the conjugate bonding groups of the other oriented organic molecules; and a polar functional group that does not include active hydrogen and that is located at any portion between the terminal bonding group and the conjugate bonding group on the oriented organic molecules, wherein the polar functional group that does not include active hydrogen is at least one group selected from an ester group (—COO—), an oxycarbonyl group (—OCO—), a carbonyl group (—CO—), and a carbonate group (—OCOO—), and bonded to both sides of the polar functional group are alkylene groups which are —(CH2)m- and —(CH2)n-, where m and n are integers; and the oriented organic molecules with their conjugate bonding groups are polymerized, forming a conduction network; wherein the third electrode is sandwiched between the substrate and a conductive organic thin film, is insulated from said first and second electrodes, and controls an electric field that acts on the conductive organic thin film by the voltage applied between itself and the first electrode or the second electrode, the electroluminescence-type display device comprising: an array substrate on which a plurality of the switching elements are arranged in a matrix on a transparent substrate; a common electrode that opposes the array substrate; and a light-emission layer formed between the array substrate and the common electrode, and which includes a light-emitting substance that emits light due to the application of an electric field.

* * * * *

UNITED STATES PATENT AND TRADEMARK OFFICE
CERTIFICATE OF CORRECTION

| | |
|---|---|
| PATENT NO. | : 7,220,468 B2 |
| APPLICATION NO. | : 11/488994 |
| DATED | : May 22, 2007 |
| INVENTOR(S) | : Ogawa et al. |

Page 1 of 1

It is certified that error appears in the above-identified patent and that said Letters Patent is hereby corrected as shown below:

Title Page item 56
Second page, second column, line 17 of Other Publications: "Marcromolecular" should read --Macromolecular--.
Column 34, line 36(claim 1): "at least on selected" should read --at least one selected--.

Signed and Sealed this

Fourth Day of December, 2007

JON W. DUDAS
*Director of the United States Patent and Trademark Office*